US012534805B2

(12) United States Patent
Wan et al.

(10) Patent No.: US 12,534,805 B2
(45) Date of Patent: Jan. 27, 2026

(54) ALD PROCESSING APPARATUS AND PROCESSING METHOD

(71) Applicant: ADVANCED MATERIALS TECHNOLOGY & ENGINEERING.CO.LTD., Jiangsu (CN)

(72) Inventors: Jun Wan, Jiangsu (CN); Haitao Liao, Jiangsu (CN); Bin Wang, Jiangsu (CN); Hui Wang, Jiangsu (CN)

(73) Assignee: ADVANCED MATERIALS TECHNOLOGY & ENGINEERING, CO, LTD., Jiangsu (CN)

( * ) Notice: Subject to any disclaimer, the term of this patent is extended or adjusted under 35 U.S.C. 154(b) by 92 days.

(21) Appl. No.: 18/325,094

(22) Filed: May 29, 2023

(65) Prior Publication Data

US 2023/0304152 A1 Sep. 28, 2023

Related U.S. Application Data

(63) Continuation-in-part of application No. PCT/CN2020/141154, filed on Dec. 30, 2020.

(30) Foreign Application Priority Data

Dec. 3, 2020 (CN) .......................... 202011412184.4
Dec. 3, 2020 (CN) .......................... 202022904146.2

(51) Int. Cl.
*C23C 16/455* (2006.01)
*C23C 16/52* (2006.01)

(52) U.S. Cl.
CPC ........ *C23C 16/45551* (2013.01); *C23C 16/52* (2013.01)

(58) Field of Classification Search
CPC .......................... C23C 16/45551; C23C 16/52
(Continued)

(56) References Cited

U.S. PATENT DOCUMENTS

2006/0021573 A1* 2/2006 Monsma ........... C23C 16/45525
118/715
2009/0297710 A1* 12/2009 Lindfors ............... C23C 16/403
118/728
(Continued)

FOREIGN PATENT DOCUMENTS

CN 109689930 A 4/2019
CN 210030882 U 2/2020
(Continued)

OTHER PUBLICATIONS

Applicant: Advanced Materials Technology & Engineering, Inc.; "ALD Processing Apparatus and Processing Method"; International Application No. PCT/CN2020/141154 filed Dec. 30, 2020; PCT International Written Opinion dated Aug. 27, 2021; 3 pgs.
(Continued)

*Primary Examiner* — Charlee J. C. Bennett
(74) *Attorney, Agent, or Firm* — DINSMORE & SHOHL LLP

(57) ABSTRACT

Provided are an ALD processing apparatus and a processing method. A reactor of the processing apparatus includes a vacuum chamber and a reaction chamber, the reaction chamber is built in the vacuum chamber and is open at a top, a bottom of the reaction chamber is formed with a gas inlet channel and a gas outlet channel arranged opposite to each other with respect to centerline of the bottom of the reaction chamber in a first direction, a lifting device is provided on the reactor, an output end of the lifting device stretches and contracts vertically and is provided with a sealing cover, which operably seals the top of the reaction chamber, a transporting device is configured to transport a substrate into (Continued)

the vacuum chamber, a grabbing device is provided on the sealing cover, and the grabbing device is configured to grab the substrate transported into the vacuum chamber.

19 Claims, 8 Drawing Sheets

(58) Field of Classification Search
 USPC .......................................................... 118/715
 See application file for complete search history.

(56) References Cited

U.S. PATENT DOCUMENTS

| | | | | |
|---|---|---|---|---|
| 2010/0116207 | A1* | 5/2010 | Givens | C23C 16/45591 |
| | | | | 118/715 |
| 2013/0208432 | A1* | 8/2013 | Bang | H05K 1/0201 |
| | | | | 361/752 |
| 2015/0059981 | A1* | 3/2015 | Huston | C23C 16/46 |
| | | | | 118/733 |
| 2015/0299859 | A1* | 10/2015 | Kilpi | H01L 21/67781 |
| | | | | 427/255.28 |
| 2019/0172690 | A1* | 6/2019 | Chihaya | H01J 37/32449 |
| 2019/0194809 | A1* | 6/2019 | Holm | C23C 16/4412 |
| 2020/0126802 | A1* | 4/2020 | Lee | H01L 21/67742 |
| 2021/0074565 | A1* | 3/2021 | Kim | H01L 21/67379 |

FOREIGN PATENT DOCUMENTS

| | | | |
|---|---|---|---|
| KR | 100983730 | B1 * | 9/2010 |
| KR | 101055064 | B1 | 8/2011 |

OTHER PUBLICATIONS

Applicant: Advanced Materials Technology & Engineering, Inc.; "ALD Processing Apparatus and Processing Method"; International Application No. PCT/CN2020/141154 filed Dec. 30, 2020; PCT International Search Report dated Aug. 27, 2021; 6 pgs.

\* cited by examiner

ALD PROCESSING APPARATUS AND PROCESSING METHOD

CROSS-REFERENCE TO RELATED APPLICATIONS

This application is a Continuation-In-Part patent application of International Application No. PCT/CN2020/141154 filed Dec. 30, 2020, which claims priority to Chinese Patent Application No. 202011412184.4 filed Dec. 3, 2020, and Chinese Patent Application No. 202022904146.2, filed on Dec. 3, 2020, the disclosure of which is incorporated by reference herein in its entirety as part of the present application.

TECHNICAL FIELD

The present disclosure relates to the technical field of semiconductor nano-thin film deposition, and in particular, to an ALD processing apparatus and processing method.

BACKGROUND ART

With the continuous improvement of IC complexity, characteristic dimensions of metal-oxide-semiconductor field effect transistor devices in silicon-based semiconductor integrated circuits will reach nanoscale in accordance with the well-known Moore's law and International Technology Roadmap for Semiconductors published by the International Semiconductor Industry Association. Atomic layer deposition (ALD) has the characteristics such as excellent three-dimensional conformality, large-area uniformity, and accurate sub-monolayer thickness control, and is favored by the microelectronics industry and the nanotechnology field.

In the prior art, the technical solution of atomic layer deposition processing is: placing a substrate in a sealed reactor, and then alternately introducing a gas-phase precursor source into the reactor, so as to perform chemisorption and reaction on the substrate to form a deposition film.

In the technical solutions of implementing the present disclosure, the applicant found that the prior art has at least the following shortcomings:

The technical solution of introducing the gas-phase precursor source into the reactor in pulse in the prior art is difficult to ensure that the precursor source fully covers the whole substrate, and defectiveness such as pin holes are easy to form, leading to non-uniform contact between the precursor source and the substrate, and causing poor uniformity of the deposition film, then the quality is difficult to ensure, and meanwhile, due to incomplete reaction, a large amount of precursor source will remain if a large amount of precursor source is introduced, leading to low film-forming efficiency, a long cycle, and waste of the precursor source.

Therefore, the prior art needs to be improved.

SUMMARY

An ALD processing apparatus and a processing method, which solves or partially solves the technical problems that the deposition film has poor uniformity, the quality is difficult to ensure, the film-forming efficiency is low, the cycle is long, and waste of the precursor source is caused in the prior art.

In one aspect, the present disclosure provides an ALD processing apparatus, wherein the processing apparatus includes:

a reactor, wherein the reactor includes a vacuum chamber and a reaction chamber, the reaction chamber is built in the vacuum chamber, the reaction chamber is open at a top, a bottom of the reaction chamber is provided with a gas inlet channel and a gas outlet channel, and the gas inlet channel and the gas outlet channel are arranged opposite to each other with respect to a centerline of the bottom of the reaction chamber in a first direction; a lifting device, wherein the lifting device is provided on the reactor, an output end of the lifting device stretches and contracts vertically, the output end of the lifting device is provided with a sealing cover, and the sealing cover operably seals the top of the reaction chamber; a transporting device, wherein the transporting device is configured to transport a substrate into the vacuum chamber; and a grabbing device, wherein the grabbing device is provided on the sealing cover, and the grabbing device is configured to grab the substrate transported into the vacuum chamber.

In the other aspect, the present disclosure further provides an ALD processing method, wherein the processing method is carried out on the basis of the above ALD processing device, and the processing method includes: transporting the substrate into the vacuum chamber through the transporting device, and transferring the substrate onto the grabbing device; operating the transporting device to withdraw from the vacuum chamber, sealing the vacuum chamber, and vacuumizing the vacuum chamber; operating the lifting device to cover the top of the reaction chamber with the sealing cover, wherein the substrate is located in the sealed reaction chamber; and injecting a precursor source from the gas inlet channel of the reaction chamber, and after purging the substrate in the reaction chamber with the precursor source, discharging the precursor source from the gas outlet channel of the reaction chamber, thus completing the ALD processing of the substrate.

BRIEF DESCRIPTION OF DRAWINGS

In order to more clearly illustrate technical solutions in the embodiments of the present disclosure, drawings which need to be used in the description of the embodiments will be introduced briefly below, and apparently, the drawings in the description below merely show some embodiments of the present disclosure, and a person ordinarily skilled in the art still could obtain other drawings in light of these drawings, without using any creative efforts.

In the drawings.

Figure 1:
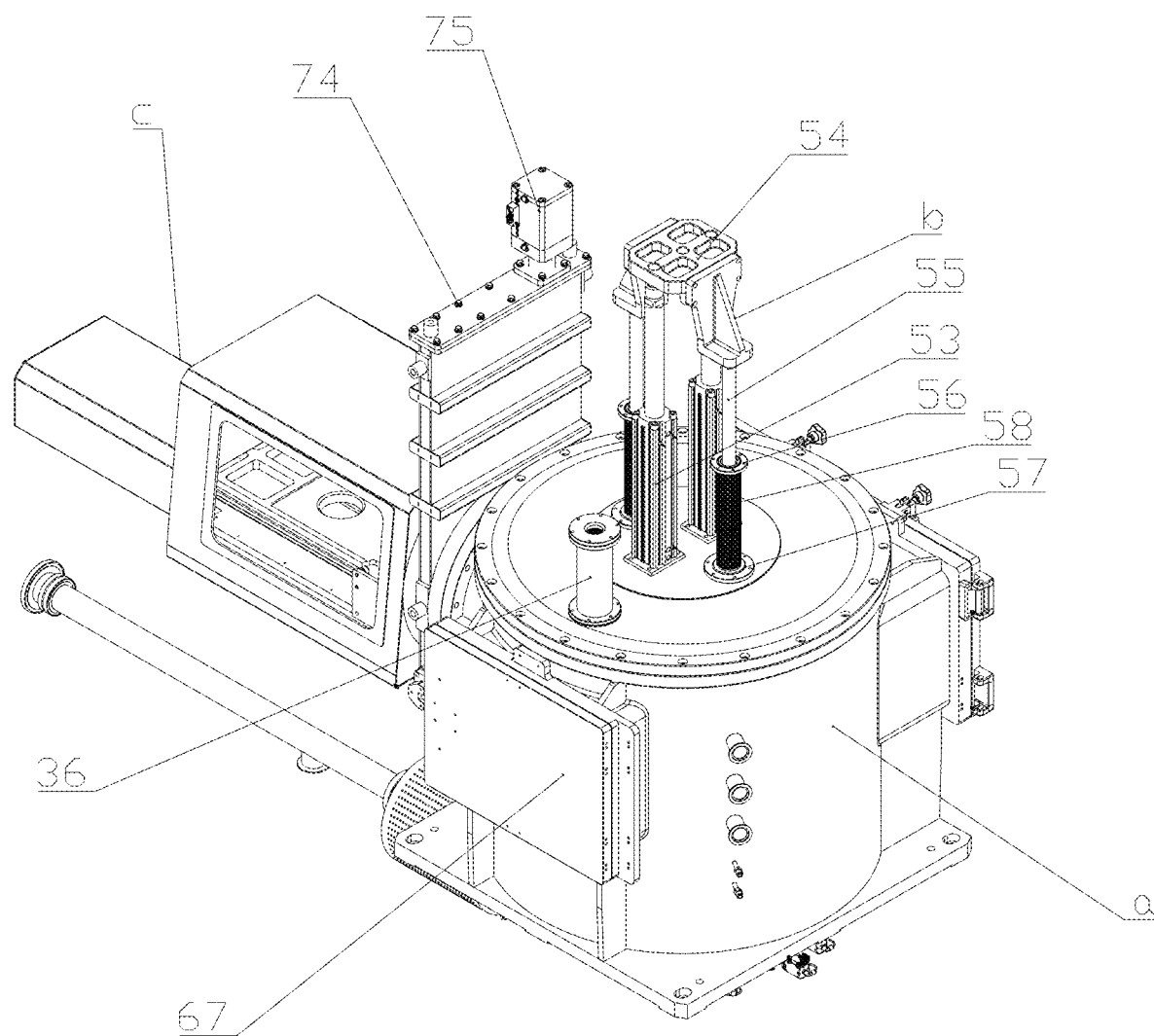
FIG. 1 is a structural schematic diagram of an ALD processing apparatus according to one or more embodiments of present disclosure.

a—reactor, b—lifting device, c—transporting device, d—grabbing device, e—substrate, 1—vacuum chamber, 2—reaction chamber, 3—gas inlet channel, 4—gas outlet channel, 5—sealing cover, 6—gas homogenizing plate, 7—transferring chamber, 701—first chamber, 702—second chamber, 703—third chamber, 8—partition plate, 9—gas inlet main hole, 10—gas outlet main hole, 11—projection, 12—connection block, 13—gas inlet pipe, 14—gas outlet pipe, 15—gas inlet device, 16—gas outlet device, 17—first heater, 18—second heater, 19—third heater, 20—first mounting plate, 21—supporting block, 22—first limiting stop edge, 23—first heat reflection assembly, 24—fixing block, 25—second mounting plate, 26—second limiting stop edge, 27—annular groove, 28—second heat reflection assembly, 29—third mounting plate, 30—third heat reflection assembly, 31—first step, 32—fourth mounting plate, 33—third limiting stop edge, 34—fourth heat reflection assembly, 35—second step, 36—fixed sleeve, 37—first corrugated pipe, 38—connecting sleeve, 39—thermocouple, 40—first connecting flange, 41—first sealing groove, 42—first sealing ring, 43—second sealing groove, 44—second sealing ring, 45—second connecting flange, 46—third connecting flange, 47—connecting cover plate, 48—fourth connecting flange, 49—third sealing groove, 50—third sealing ring, 51—first stopper, 52—boss, 53—lifting unit, 54—connecting frame, 55—connecting rod, 56—first sleeve, 57—second sleeve, 58—second corrugated pipe, 59—fourth sealing ring, 60—fourth sealing groove, 61—guide sleeve, 62—second stopper, 63—guide cap, 64—notch, 65—frame, 66—gripper, 661—connecting arm, 662—supporting arm, 663—connecting projection, 664—reinforcing arm, 67—enclosing plate, 68—transporting chamber, 69—transporting plate, 70—first driving unit, 71—roller, 72—transporting groove, 73—slot, 74—supporting frame, 75—second driving unit, 76—connecting plate, 77—vacuum pipe, 78—vacuumizing device.

DETAILED DESCRIPTION OF EMBODIMENTS

The technical solutions in the embodiments of the present disclosure will be described clearly and completely below in conjunction with the drawings in the embodiments of the present disclosure, and apparently, some but not all embodiments of the present disclosure are described. Generally, components in the embodiments of the present disclosure, as described and shown in the drawings herein, may be arranged and designed in various different configurations. Therefore, the detailed description below of the embodiments of the present disclosure provided in the drawings is not intended to limit the scope of the present disclosure claimed, but merely illustrates chosen embodiments of the present disclosure. All of other embodiments obtained by a person skilled in the art based on the embodiments of the present disclosure without using any creative efforts shall fall within the scope of protection of the present disclosure.

In the present disclosure, orientation or positional relationships indicated by terms such as "upper", "lower", "left", "right", "front", "rear", "top", "bottom", "inner", "outer", "middle", "vertical", "horizontal", "transverse", and "longitudinal" are based on orientation or positional relationships as shown in the drawings. These terms are mainly used to better describe the present disclosure and embodiments thereof, and are not used to limit that the indicated device, element, or component must be in a specific orientation, or be constructed and operated in a specific orientation.

In addition, some of the above terms may be used to indicate other meanings in addition to the orientation or positional relationships, for example, the term "upper" may also be used to indicate a certain attachment relationship or connection relationship in some cases. For those ordinarily skilled in the art, specific meanings of the above-mentioned terms in the present disclosure can be understood according to specific cases.

Besides, terms "install", "set", "provide", "connect", and "join" should be understood in a broad sense. For example, it may be a fixed connection, a detachable connection, or an integral connection; it may be a mechanical connection, and also may be an electrical connection; it may be a direct connection, indirect connection through an intermediary, or inner communication between two devices, elements or components. For those ordinarily skilled in the art, specific meanings of the above-mentioned terms in the present disclosure could be understood according to specific circumstances.

Besides, terms such as "first" and "second" are mainly used to distinguish different devices, elements or components (specific types and structures may be the same or different), rather than indicating or implying the relative importance or quantity of the indicated device, element or component. "Multiple (a plurality of)" refers to two or more, unless otherwise illustrated.

The present disclosure provides an ALD processing apparatus, wherein the processing apparatus includes: a reactor, wherein the reactor includes a vacuum chamber and a reaction chamber, the reaction chamber is built in the vacuum chamber, the reaction chamber is open at a top, and a bottom of the reaction chamber is provided with a gas inlet channel and a gas outlet channel, wherein the gas inlet channel and the gas outlet channel are arranged opposite to each other with respect to a centerline of the bottom of the reaction chamber in a first direction; a lifting device, wherein the lifting device is provided on the reactor, an output end of the lifting device stretches and contracts vertically, the output end of the lifting device is provided with a sealing cover, and the sealing cover operably seals the top of the reaction chamber; a transporting device, wherein the transporting device is configured to transport a substrate into the vacuum chamber; and a grabbing device, wherein the grabbing device is provided on the sealing cover, and the grabbing device is configured to grab the substrate transported into the vacuum chamber.

In some embodiments, the gas inlet channel is hole-shaped, a plurality of the gas inlet channels are provided, and the plurality of the gas inlet channels are provided on one side of the bottom of the reaction chamber; and the gas outlet channel is hole-shaped, a plurality of the gas outlet channels are also provided, and the plurality of the gas outlet channels are provided on the other side of the bottom of the reaction chamber.

In some embodiments, multiple sets of the gas inlet channels are provided, and the multiple sets of the gas inlet channels are provided in sequence along a second direction, each set of the gas inlet channels is arc-shaped, and an aperture of each gas inlet channel of each set of the gas inlet channels is gradually reduced in a direction towards the centerline of the bottom of the reaction chamber in the first direction; and multiple sets of the gas outlet channels are provided, the multiple sets of the gas outlet channels are provided in sequence along the second direction, each set of the gas outlet channels is arc-shaped, and an aperture of each gas outlet channel of each set of the gas outlet channels is gradually reduced in a direction towards the centerline of the bottom of the reaction chamber in the first direction.

In some embodiments, the gas inlet channel is strip-shaped, a plurality of the gas inlet channels are provided, and the plurality of the gas inlet channels are provided on one side of the bottom of the reaction chamber; and the gas outlet channel is strip-shaped, a plurality of the gas outlet channels are also provided, and the plurality of the gas outlet channels are provided on the other side of the bottom of the reaction chamber.

In some embodiments, a dimension of the gas inlet channel in a second direction is gradually reduced in a direction towards the centerline of the bottom of the reaction chamber in the first direction; and a dimension of the gas outlet channel in the second direction is gradually reduced in the direction towards the centerline of the bottom of the reaction chamber in the first direction.

In some embodiments, two gas homogenizing plates are provided in the reaction chamber, the two gas homogenizing plates are provided opposite to each other with respect to the centerline of the bottom of the reaction chamber in the first direction, and the two gas homogenizing plates are provided between the gas inlet channel and the gas outlet channel, the two gas homogenizing plates divide the reaction chamber into a gas inlet chamber, the reaction chamber, and a gas outlet chamber along a second direction, and the gas homogenizing plates are each provided thereon with a plurality of via holes.

In some embodiments, a transferring chamber is fixedly provided at the bottom of the reaction chamber, the transferring chamber is open at a top, the bottom of the reaction chamber is provided on and covers the top of the transferring chamber, and two partition plates are provided in the transferring chamber, wherein the two partition plates divide the transferring chamber into a first chamber, a second chamber, and a third chamber along a second direction, the gas inlet channel is in communication with the first chamber, and the gas outlet channel is in communication with the third chamber, wherein a bottom of the first chamber is provided with a gas inlet main hole, and a bottom of the third chamber is provided with a gas outlet main hole.

In some embodiments, the two partition plates are provided between the gas inlet channel and the gas outlet channel, the gas inlet main hole is provided between the gas inlet channel and the partition plate on the same side, and the gas outlet main hole is provided between the gas outlet channel and the partition plate on the same side, wherein the gas inlet main hole and the gas outlet main hole are provided opposite to each other with respect to the centerline of the bottom of the reaction chamber in the first direction.

In some embodiments, two opposite projections are provided at a bottom of the transferring chamber; and two opposite connection blocks are provided between the bottom of the transferring chamber and a bottom of the vacuum chamber, a positioning groove is provided on a top of each of the connection blocks, and the projections are fixedly embedded in corresponding positioning grooves of the connection blocks.

In some embodiments, the two protrusions are provided at bottoms of the gas inlet main hole and the gas outlet main hole respectively; the processing apparatus further includes a gas inlet pipe and a gas outlet pipe, wherein one end of the gas inlet pipe passes through the bottom of the vacuum chamber, and the connection block and the protrusion located at the bottom of the gas inlet main hole in sequence, one end of the gas inlet pipe is in communication with the gas inlet main hole, and the other end of the gas inlet pipe is configured to be in communication with a gas inlet device; and one end of the gas outlet pipe passes through the bottom of the vacuum chamber, and the connection block and the protrusion located at the bottom of the gas outlet main hole in sequence, one end of the gas outlet pipe is in communication with the gas outlet main hole, and the other end of the gas outlet pipe is configured to be in communication with a gas outlet device.

In some embodiments, the processing apparatus further includes: a first heater, wherein the first heater is provided on a top of the sealing cover, and an output end of the first heater acts on the sealing cover; a second heater, wherein the second heater is provided between an outer side wall of the reaction chamber and an inner side wall of the vacuum chamber, and an output end of the second heater acts on a side wall of the reaction chamber; and a third heater, wherein the third heater is provided between the bottom of the reaction chamber and the bottom of the vacuum chamber, and the third heater acts on the bottom of the reaction chamber.

In some embodiments, a first mounting plate is fixedly provided on the top of the sealing cover, the first heater includes a plurality of first heating wires, a plurality of the first heating wires are arranged in concentric corrugations, and a plurality of the first heating wires are all fixed on a bottom surface of the first mounting plate.

In some embodiments, an outer edge of the first mounting plate is bent downwards to form a first limiting stop edge.

In some embodiments, the processing apparatus further includes a first heat reflection assembly, and the first heat reflection assembly is fixedly arranged on a top surface of the first mounting plate.

In some embodiments, a fixing block is provided on the top surface of the first mounting plate, and the first heat reflection assembly is provided between the first mounting plate and the fixing block; and the first heat reflection assembly includes several heat reflecting plates arranged in sequence, and two adjacent heat reflecting plates contact in a form of multi-point contact.

In some embodiments, a second mounting plate is provided between the outer side wall of the reaction chamber and the inner side wall of the vacuum chamber, and two ends of a circumferential surface of the second mounting plate are closed rings, wherein the second mounting plate is fixedly provided on a top surface of the bottom of the vacuum chamber, and the second heater includes a plurality of second heating wires, wherein all the second heating wires are coaxially arranged in a ring shape, the second heating wires are each fixedly provided on an inner side wall of the second mounting plate in a vertical direction, and the second heating wires are each sleeved on the outer side wall of the reaction chamber.

In some embodiments, two ends of the second mounting plate are turned inwards to form second limiting stop edges.

In some embodiments, the processing apparatus further includes a second heat reflection assembly, and the second heat reflection assembly is fixedly arranged on an outer side surface of the second mounting plate.

In some embodiments, the processing apparatus further includes a third mounting plate, wherein the third mounting plate is fixedly provided between the second mounting plate and an inner wall of the vacuum chamber, the third mounting plate is in a closed loop, and the second heat reflection assembly is provided between the third mounting plate and the second mounting plate; and the second heat reflection assembly includes several heat reflecting plates arranged in sequence, and two adjacent heat reflecting plates contact in a form of multi-point contact.

In some embodiments, the top surface of the bottom of the vacuum chamber is provided with an annular groove, and the third mounting plate and the second heat reflection assembly are both fixedly provided in the annular groove.

In some embodiments, the processing apparatus further includes a third heat reflection assembly, and the third heat reflection assembly is fixedly arranged on an outer side surface of the third mounting plate; the third heat reflection assembly includes several heat reflecting plates arranged in sequence, and two adjacent heat reflecting plates contact in a form of multi-point contact.

In some embodiments, a first step is provided on the top surface of the bottom of the vacuum chamber, the first step is located outside the annular groove, and a bottom of the third heat reflection assembly is fixed on the first step.

In some embodiments, a fourth mounting plate is provided between the bottom of the reaction chamber and the bottom of the vacuum chamber, the third heater includes a plurality of third heating wires, a plurality of the third heating wires are arranged in concentric corrugations, and a plurality of the third heating wires are all fixed on a top surface of the fourth mounting plate.

In some embodiments, an outer edge of the fourth mounting plate is bent upwards to form a third limiting stop edge.

In some embodiments, the processing apparatus further includes a fourth heat reflection assembly, and the fourth heat reflection assembly is fixedly arranged on a bottom surface of the fourth mounting plate; the fourth heat reflection assembly includes several heat reflecting plates arranged in sequence, and two adjacent heat reflecting plates contact in a form of multi-point contact.

In some embodiments, two stages of second steps are vertically provided in sequence on a circumferential surface of each of the connection blocks, the fourth mounting plate is fixedly provided on the second step located above, and the fourth heat reflection assembly is fixedly provided between the second step located below and the fourth mounting plate.

In some embodiments, the processing apparatus further includes a thermocouple mounting mechanism, and the thermocouple mounting mechanism includes: a fixed sleeve, wherein the fixed sleeve is fixedly provided on the top surface of the vacuum chamber; a first corrugated pipe, wherein an upper end of the first corrugated pipe is fixedly connected to a top of an inner wall of the fixed sleeve, a lower end of the first corrugated pipe passes through a lower end of the fixed sleeve and the top of the vacuum chamber in sequence, and the lower end of the first corrugated pipe is located in the vacuum chamber; a connecting sleeve, wherein the connecting sleeve is fixedly provided in the vacuum chamber, the lower end of the first corrugated pipe is connected to a top surface of the connecting sleeve, and a heating wire of the first heating assembly provided on the top of the sealing cover and a thermocouple for measuring a temperature on the top of the sealing cover are both fixedly provided in the connecting sleeve.

In some embodiments, the top of the fixed sleeve is provided with a first connecting flange, the first connecting flange is annular, an inner side of the first connecting flange protrudes from the inner wall of the fixed sleeve, and the upper end of the first corrugated pipe is connected to the inner side of the first connecting flange.

In some embodiments, a first sealing groove is provided on the top of the fixed sleeve, a first sealing ring is provided in the first sealing groove, and the first connecting flange is provided on and covers the first sealing groove.

In some embodiments, a second sealing groove is provided on the top surface of the vacuum chamber, a second sealing ring is provided in the second sealing groove, a second connecting flange is provided on the bottom of the fixed sleeve, and the second connecting flange is provided on and covers the second sealing groove.

In some embodiments, the top of the connecting sleeve is provided with a third connecting flange, and the lower end of the first corrugated pipe is connected to a top of the third connecting flange.

In some embodiments, the inside of the connecting sleeve is sealed by a connecting cover plate, wherein three thermocouples are all provided on the connecting cover plate, and a heating wire of the heating assembly provided on the top of the sealing cover and the thermocouple for measuring the temperature on the top of the sealing cover both pass through the connecting cover plate in a sealed manner.

In some embodiments, a first stopper is provided at an edge of the bottom of the sealing cover; and a boss is provided an opening on the top of the reaction chamber, and the boss can be embedded into the first stopper.

In some embodiments, the lifting device includes a lifting unit, a connecting frame, and a connecting rod, wherein the lifting unit is fixedly provided on the top of the vacuum chamber, the output end of the lifting unit stretches and contracts vertically; the connecting frame is located above the vacuum chamber, and the connecting frame is connected with the output end of the lifting unit; an upper end of the connecting rod is fixedly connected with the connecting frame, a lower end of the connecting rod passes through the top of the vacuum chamber in a sealed manner, and the sealing cover is fixedly provided on the lower end of the connecting rod.

In some embodiments, two lifting units are provided opposite to each other, are two connecting rods are provided opposite to each other, and a connecting line of the two lifting units is located on a perpendicular bisector of a connecting line of the two connecting rods.

In some embodiments, the connecting rods are each provided with a sealing device, and the sealing device includes: a first sleeve, wherein the first sleeve is fixedly provided on a circumferential surface of the connecting rod, and the first sleeve is located above the vacuum chamber; a second sleeve, wherein the second sleeve is fixedly arranged on a top surface of the top of the vacuum chamber, and the other end of the connecting rod movably passes through the second sleeve, so as to enter the vacuum chamber; and a second corrugated pipe, wherein the first sleeve and the second sleeve are connected through the second corrugated pipe, and the second corrugated pipe is sleeved on the circumferential surface of the connecting rod.

In some embodiments, a fourth sealing groove is provided on the top surface of the top of the vacuum chamber, a bottom of the second sleeve is provided on and covers the fourth sealing groove, and a fourth sealing ring is provided in the fourth sealing groove.

In some embodiments, a through hole for the connecting rod to pass through is provided on the top of the vacuum chamber, wherein the through hole is provided inside the fourth sealing groove, a guide sleeve is provided in the through hole, and the connecting rod passes through the guide sleeve in a sliding fit manner.

In some embodiments, a top surface of the through hole is provided with a second stopper; a guide cap is provided on a top of the guide sleeve, and the guide cap is fixedly provided on the second stopper.

In some embodiments, two axial ends of an inner wall of the guide sleeve are each provided with a notch.

In some embodiments, the grabbing device includes: a frame, wherein the frame is fixedly provided on a bottom of the sealing cover; grippers, wherein two grippers are provided opposite to each other, the two grippers are arranged opposite to each other along a second direction, the grippers each include two connecting arms and a supporting arm, upper ends of the two connecting arms are each fixedly connected to an end of the frame in the first direction, and lower ends of the two connecting arms are each provided with a connecting projection extending in a direction towards the other gripper, wherein the two connecting projections are connected through the supporting arm.

In some embodiments, middle portions of the two connecting arms are also connected by a reinforcing arm.

In some embodiments, a detachable enclosing plate is further provided at two sides of a vacuum chamber in a first direction.

In some embodiments, the enclosing plate is made of a transparent material.

In some embodiments, the transporting device includes a transporting chamber and a transporting plate, wherein the transporting chamber is arranged on a side of the vacuum chamber in a second direction, and the transporting chamber is in operable communication with the vacuum chamber, and wherein the transporting plate is provided in the transporting chamber, the transporting plate operably enters the vacuum chamber, and the transporting plate is provided above the reaction chamber.

In some embodiments, a first driving unit is provided in the transporting chamber, an output end of the first driving unit can linearly move back and forth, and the transporting plate is fixedly connected to an output end of the first driving unit.

In some embodiments, two guide assemblies are vertically provided on each of two side walls of the transporting chamber in the second direction, each guide assembly includes a plurality of rollers spaced apart in the second direction, and the rollers are rotatably connected to the side wall of the transporting chamber in the second direction, wherein two sides of the transporting plate in the second direction are respectively provided between two guide assemblies.

In some embodiments, a transporting groove is provided on a top surface of the transporting plate.

In some embodiments, a sealing door that can be opened is provided at the side of the vacuum chamber in the second direction.

In some embodiments, a slot is provided at a joint between the vacuum chamber and the transporting chamber, the slot is open on a top, and the sealing door is operably inserted into the slot, so as to seal the side of the vacuum chamber in the second direction; a supporting frame is provided on the vacuum chamber, a second driving mechanism is provided on the supporting frame, an output end of the second driving mechanism vertically moves back and forth, and the sealing door is connected to the output end of the second driving mechanism.

In some embodiments, the supporting frame includes two butt-jointed connecting plates, the two connecting plates are butt-jointed to form a sealed chamber, the second driving mechanism is fixedly provided on the top of the sealed chamber, a bottom of the sealed chamber is open, and a dimension of the sealed chamber in a width direction is consistent with a thickness of the sealing door.

The present disclosure further provides an ALD processing method, wherein the processing method is carried out on the basis of the above ALD processing device, and the processing method includes: transporting the substrate into the vacuum chamber through the transporting device, and transferring the substrate onto the grabbing device; operating the transporting device to withdraw from the vacuum chamber, sealing the vacuum chamber, and vacuumizing the vacuum chamber; operating the lifting device to cover the top of the reaction chamber with the sealing cover, wherein the substrate is located in the sealed reaction chamber; and injecting a precursor source from the gas inlet channel of the reaction chamber, and after purging the substrate in the reaction chamber with the precursor source, discharging the precursor source from the gas outlet channel of the reaction chamber, thus completing the ALD processing of the substrate.

In the embodiments of the present disclosure, as the precursor source is injected into the reaction chamber from the gas inlet channel of the reaction chamber and discharged from the gas outlet channel of the reaction chamber, and as the gas inlet channel and the gas outlet channel are provided opposite to each other with respect to the centerline of the bottom of the reaction chamber in the first direction, a fluid field in the reaction chamber is laminar, and gas inlet and suction of the precursor source are directly in communication with the reaction chamber, thus avoiding the risk of leakage of the precursor source at a joint. In addition, flowing of the precursor source in the reaction chamber along the second direction not only can reduce a volume of the reaction chamber, but also can increase a length of uniform gas flow, and improve the uniformity of gas flow, so as to reduce the phenomenon of turbulent flow, which can ensure that the precursor source covers the entire substrate comprehensively and make the precursor source contact the substrate evenly, the uniformity of the deposition film is improved, so as to ensure the molding quality and consistency of the deposition film. The film-forming efficiency is high, the cycle is short, the utilization rate of the precursor source is improved, and it is suitable for batch production, with a very good practical value.

Embodiments of the present disclosure will be described in detail below in combination with the drawings and the embodiments, while a person skilled in the art would understand that the following embodiments are merely used for illustrating the present disclosure, but should not be considered as limitation to the scope of the present disclosure.

An embodiment of the present disclosure discloses an ALD processing apparatus.

FIG. 1 is a structural schematic diagram of an ALD processing apparatus according to one or more embodiments of the present disclosure, and referring to FIG. 1, the ALD processing apparatus in the present embodiment includes a reactor a, a lifting device b, a transporting device c, and a grabbing device d.

Figure 2:
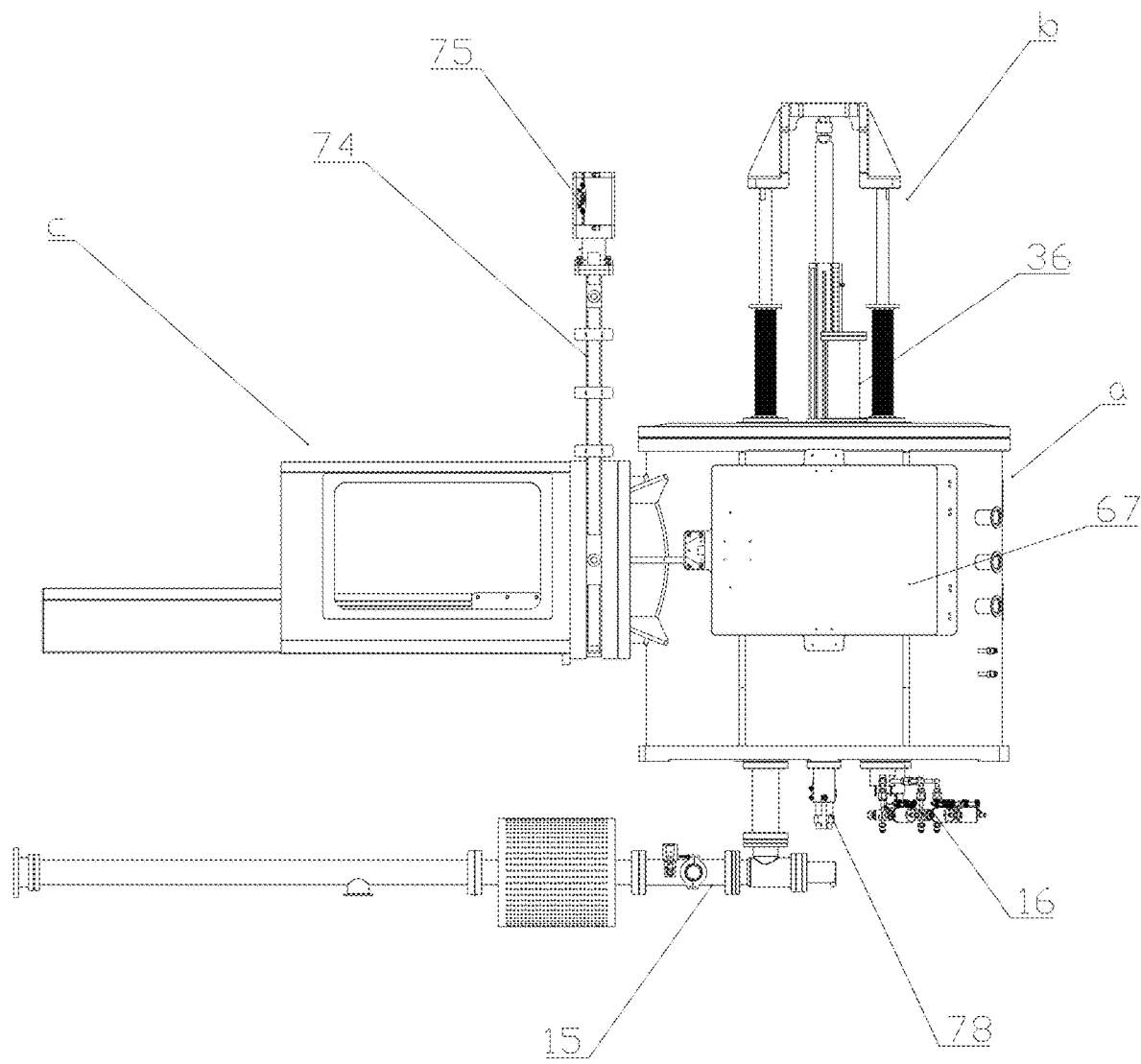
FIG. 2 is a front schematic view of FIG. 1.
Figure 3:
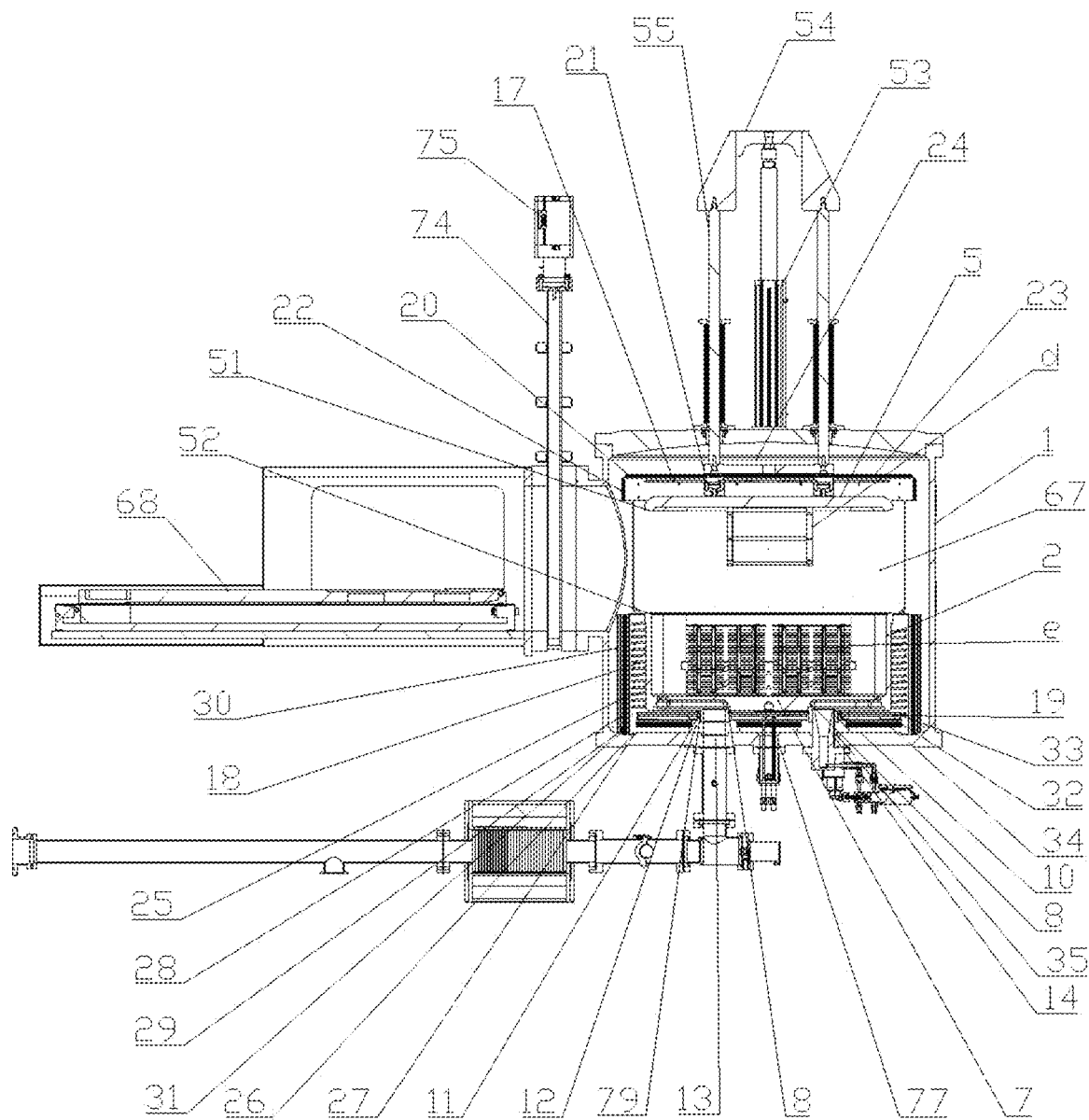
FIG. 3 is a sectional schematic view in a second direction of FIG. 2.

FIG. 2 is a front schematic view of FIG. 1, FIG. 3 is a sectional schematic view in a second direction of FIG. 2, and referring to FIG. 1-FIG. 3 in combination, the reactor a in the present embodiment includes a vacuum chamber 1 and a reaction chamber 2, the reaction chamber 2 is built in the vacuum chamber 1, and the reaction chamber 2 is open at the top.

Referring to FIG. 1-FIG. 3 in combination, the lifting device b in the present embodiment is provided on the reactor a, an output end of the lifting device b stretches and contracts vertically, the output end of the lifting device b is provided with a sealing cover 5, and the sealing cover 5 operably seals the top of the reaction chamber 2, so that the reaction chamber 2 is in a sealed environment.

Referring to FIG. 1 and FIG. 2 in combination, in the present embodiment, the transporting device c is configured to transport a substrate into the vacuum chamber 1, the grabbing device b is provided on the sealing cover 5, and after the transporting device c transports the substrate into the vacuum chamber 1, the substrate can be transferred by the grabbing device b, subsequently, the lifting device b is operated to drive the sealing cover 5 to seal on the top of the reaction chamber 2, and synchronously drive the grabbing device b with the substrate to move into the reaction chamber 2 to be processed.

An embodiment of the present disclosure provides a reaction chamber, adapted to the above ALD processing apparatus.

Figure 4:
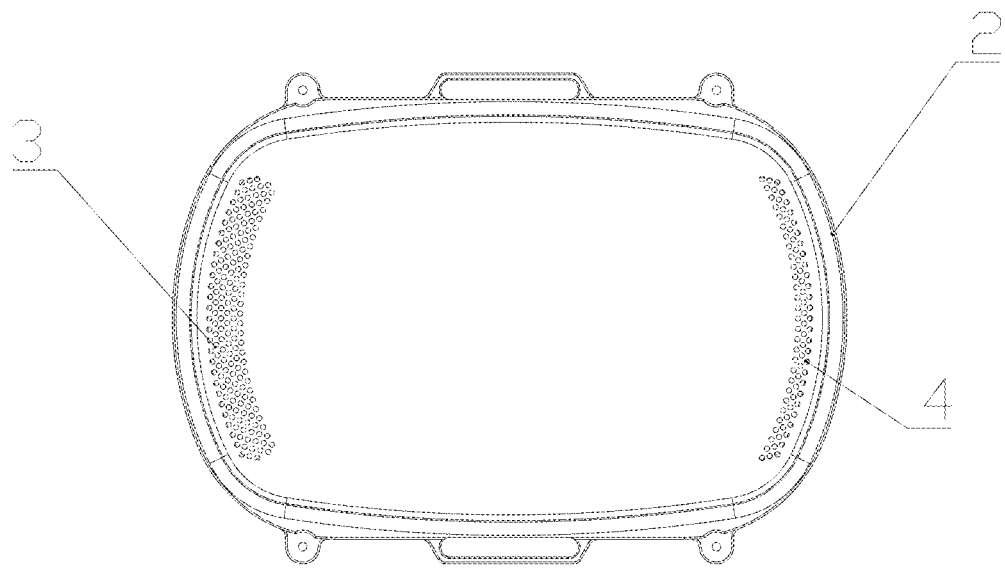
FIG. 4 is a structural schematic diagram of a reaction chamber according to one or more embodiments of present disclosure.

FIG. 4 is a structural schematic diagram of the reaction chamber according to one or more embodiments, and referring to FIG. 3 and FIG. 4 in combination, a bottom of the reaction chamber 2 in the present embodiment is provided with a gas inlet channel 3 and a gas outlet channel 4, and the gas inlet channel 3 and the gas outlet channel 4 are arranged opposite to each other with respect to a centerline of the bottom of the reaction chamber 2 in a first direction.

In the present embodiment, the precursor source is injected into the reaction chamber 2 from the gas inlet channel 3 of the reaction chamber 2 and discharged from the gas outlet channel 4 of the reaction chamber 2, and as the gas inlet channel 3 and the gas outlet channel 4 are provided opposite to each other with respect to the centerline of the bottom of the reaction chamber 2 in the first direction, a fluid field in the reaction chamber 2 is laminar, and gas inlet and suction of the precursor source are directly in communication with the reaction chamber, thus avoiding the risk of leakage of the precursor source at a joint, in addition, flowing of the precursor source in the reaction chamber 2 along the second direction not only can reduce a volume of the reaction chamber, but also can increase a length of uniform gas flow, and improve the uniformity of gas flow, so as to reduce the phenomenon of turbulent flow, which can ensure that the precursor source covers the entire substrate comprehensively and make the precursor source contact the substrate evenly, so as to ensure the molding quality and consistency of the deposition film. The film-forming efficiency is high, the cycle is short, the utilization rate of the precursor source is improved, and it is suitable for batch production, with a very good practical value.

It should be noted that, the second direction and the first direction in the present embodiment are two directions perpendicular to each other in a horizontal plane.

With reference to FIG. 4, in the present embodiment, the gas inlet channel 3 is hole-shaped, a plurality of gas inlet channels 3 are provided, and the plurality of gas inlet channels 3 are provided on one side of the bottom of the reaction chamber 2, and correspondingly, the gas outlet channel 4 is also hole-shaped, a plurality of gas outlet channels 4 are also provided, and the plurality of gas outlet channels 4 are provided on the other side of the bottom of the reaction chamber 2.

Referring to FIG. 4, in the present embodiment, multiple sets of the gas inlet channels 3 are provided, and the multiple sets of the gas inlet channels 3 are provided in sequence along the second direction, each set of the gas inlet channels 3 is arc-shaped, and an aperture of each gas inlet channel 3 of each set of the gas inlet channels 3 is gradually reduced in a direction towards the centerline of the bottom of the reaction chamber 2 in the first direction, correspondingly, multiple sets of the gas outlet channels 4 are provided, the multiple sets of the gas outlet channels 4 are provided in sequence along the second direction, each set of the gas outlet channels 4 is arc-shaped, an aperture of each gas outlet channel 4 of each set of the gas outlet channels 4 is gradually reduced in a direction towards the centerline of the bottom of the reaction chamber 2 in the first direction, in this way, the uniformity of purging the substrate by the precursor source can be further improved, and the molding quality of the deposition film can be improved.

Definitely, the gas inlet channels 3 and the gas outlet channels 4 in the present embodiment may also be in other shapes, for example, strip-shaped and square-shaped. On the premise of being strip-shaped, a plurality of gas inlet channels 3 are provided, and the plurality of gas inlet channels 3 are provided on one side of the bottom of the reaction chamber 2; a plurality of gas outlet channels 4 are also provided, and the plurality of gas outlet channels 4 are provided on the other side of the bottom of the reaction chamber 2. In order to ensure the uniformity of purging, in the present embodiment, a dimension of each gas inlet channel 3 in the second direction is gradually reduced in the direction towards the centerline of the bottom of the reaction chamber 2 in the first direction, and a dimension of each gas outlet channel 4 in the second direction is gradually reduced in the direction towards the centerline of the bottom of the reaction chamber 2 in the first direction.

Figure 5:
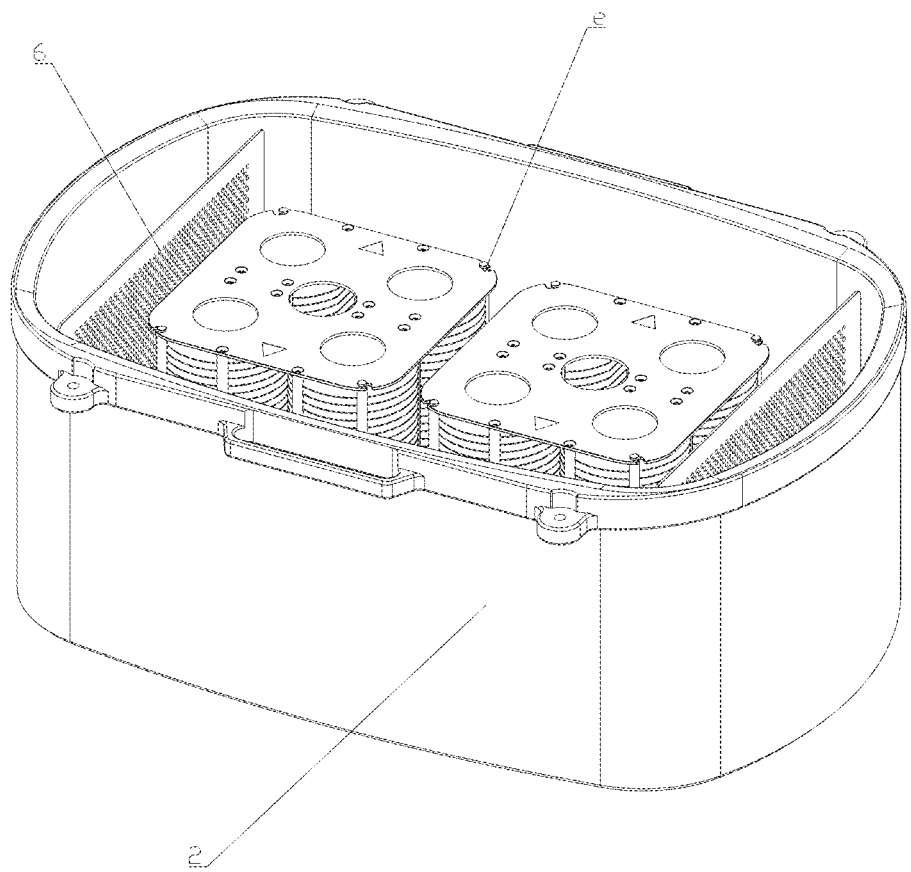
FIG. 5 is a structural schematic diagram of the reaction chamber according to an embodiment of the present disclosure.

In an embodiment of the present disclosure, a reaction chamber is provided, suitable for the above ALD processing apparatus. FIG. 5 is a structural schematic view of the reaction chamber in the present embodiment. The difference between the reaction chamber shown in the present embodiment and the reaction chamber shown in the above embodiment lies in that: two gas homogenizing plates 6 are provided in the reaction chamber 2, the two gas homogenizing plates 6 are provided opposite to each other with respect to the centerline of the bottom of the reaction chamber 2 in the first direction, the two gas homogenizing plates 6 are provided between the gas inlet channels 3 and the gas outlet channels 4, the two gas homogenizing plates 6 divide the reaction chamber into a gas inlet chamber, the reaction chamber, and a gas outlet chamber along the second direction, and each gas homogenizing plate 6 is provided thereon with a plurality of via holes.

The precursor source can enter the gas inlet chamber through the gas inlet channels 3, then enter the reaction chamber through the gas homogenizing plate 6 at the same side as the gas inlet chamber to purge the substrate, and subsequently is discharged into the gas outlet chamber through the gas homogenizing plate 6 at the same side as the gas outlet chamber, and discharged through the gas outlet channels 4. The two gas homogenizing plates 6 provided can further improve flow uniformity of the precursor source.

In addition, in the present embodiment, central axes of the via holes on the two gas homogenizing plates 6 can be arranged in an inclined manner and can be formed as being symmetrical and splayed.

In an embodiment of the present disclosure, a reaction chamber is provided, suitable for the above ALD processing apparatus.

Figure 6:
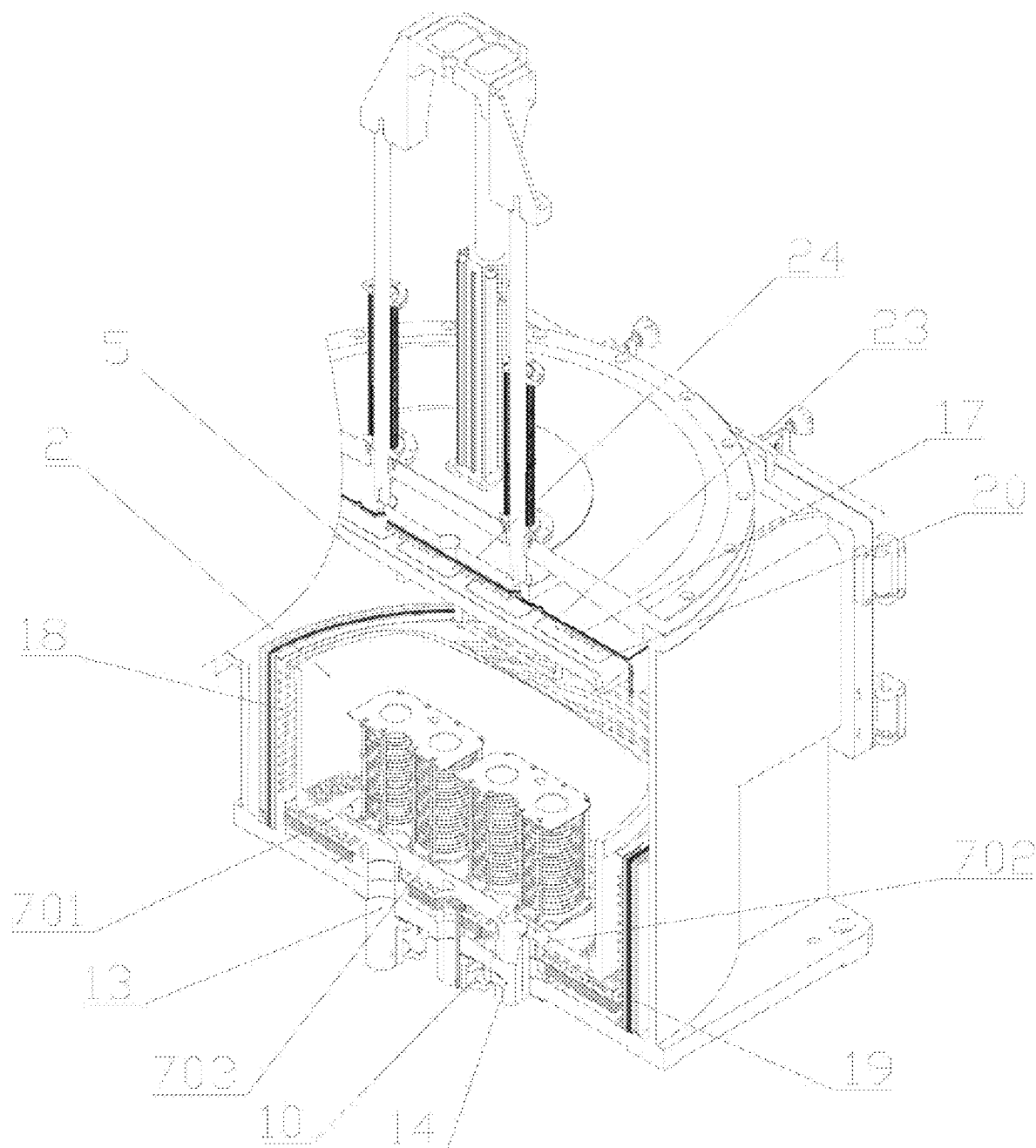
FIG. 6 is a sectional schematic view of a reactor.

FIG. 6 is a sectional schematic view of the reactor in the present embodiment, and referring to FIG. 3 and FIG. 6 in combination, in the present embodiment, a transferring chamber 7 is fixedly provided at the bottom of the reaction chamber 2, the transferring chamber 7 is open at the top, and the bottom of the reaction chamber 2 is provided on and covers the top of the transferring chamber 7, so that the transferring chamber 7 forms a sealed cavity. Two partition plates 8 are provided in the transferring chamber 7, and the two partition plates 8 divide the transferring chamber 7 into a first chamber 701, a second chamber 702, and a third chamber 703 along the second direction, wherein the gas inlet channel 3 is in communication with the first chamber 701, the gas outlet channel 4 is in communication with the third chamber 703, a bottom of the first chamber 701 is provided with a gas inlet main hole 9, and a bottom of the third chamber 703 is provided with a gas outlet main hole 10.

When in specific implementation, a gas inlet device can inject the precursor source into the first chamber 701 through the gas inlet main hole 9, and then the precursor source is transferred into the reaction chamber 2 through the first chamber 701, after purging in the reaction chamber 2, the precursor source enters the third chamber 703 and then is transferred to the gas outlet main hole 10, and is led out through a gas suction device, in this way, the gas homogenization time of the precursor source can be increased, and the purging efficiency can be improved.

In the present embodiment, top sectional views of the first chamber 701 and the third chamber 703 may be fan-shaped, and certainly, they also may be in other shapes, such as a square shape or an oval shape, which is not limited in the present embodiment. The second chamber 702 may be solid, thus improving the strength of the transferring chamber 7.

Referring to FIG. 3 and FIG. 6 in combination, in the present embodiment, the two partition plates 8 are provided between the gas inlet channels 3 and the gas outlet channels 4, the gas inlet main hole 9 is provided between the gas inlet channels 3 and the partition plate 8 on the same side, the gas outlet main hole 10 is provided between the gas outlet channels 4 and the partition plate 8 on the same side, and the gas inlet main hole 9 and the gas outlet main hole 10 are provided opposite to each other with respect to the centerline of the bottom of the reaction chamber 2 in the first direction, that is, in the present embodiment, a distance between the gas inlet main hole 9 and the gas outlet main hole 10 is smaller than a distance between the gas inlet channels 3 and the gas outlet channels 4, in this way, the gas homogenization time of the precursor source can be further increased, and the purging efficiency can be improved.

Referring to FIG. 3 and FIG. 6 in combination, in the present embodiment, two opposite projections 11 are provided at a bottom of the transferring chamber 7, two opposite connection blocks 12 are provided between the bottom of the transferring chamber 7 and a bottom of the vacuum chamber 1, a positioning groove 79 is provided on a top of each connection block 12, and the projections 11 are fixedly embedded in corresponding positioning grooves of the connection blocks 12, in this way, the reaction chamber 2 with the transferring chamber 7 can be fixed in the vacuum chamber 1. In addition, the reaction chamber 2 with the transferring chamber 7 and the vacuum chamber 1 are also connected in a detachable manner, in this way, the reaction chamber 2 with the transferring chamber 7 can be conveniently taken out from the vacuum chamber 1, so as to maintain and clean the reaction chamber 2 with the transferring chamber 7.

Referring to FIG. 3 and FIG. 6 in combination, in the present embodiment, the two protrusions 11 may be provided at the bottoms of the gas inlet main hole 9 and the gas outlet main hole 10 respectively, the processing apparatus further includes a gas inlet pipe 13 and a gas outlet pipe 14, wherein one end of the gas inlet pipe 13 passes through the bottom of the vacuum chamber 1, and the connection block 12 and the protrusion 11 located at the bottom of the gas inlet main hole in sequence, one end of the gas inlet pipe 13 is in communication with the gas inlet main hole 9, and the other end of the gas inlet pipe 13 is configured to be in communication with a gas inlet device 15, one end of the gas outlet pipe 14 passes through the bottom of the vacuum chamber 1, and the connection block 12 and the protrusion 11 located at the bottom of the gas outlet main hole 10 in sequence, one end of the gas outlet pipe 14 is in communication with the gas outlet main hole 10, and the other end of the gas outlet pipe 14 is configured to be in communication with the gas outlet device 16. By operating the gas inlet device 15 and the gas outlet device 16, purging of the precursor source in the reaction chamber 2 can be achieved.

In the present embodiment, the gas inlet pipe 13 in communication with the gas inlet device 15 and the gas outlet pipe 14 connected to the gas outlet device 16 are integrated into the corresponding protrusions 11 and connection blocks 12, which can simplify the structure and facilitate the manufacturing. Definitely, in the present embodiment, the protrusion 11 and the connection block 12 may also be additionally provided, so as to fix the reaction chamber 2 with the transferring chamber 7 in the vacuum chamber 1, which is not limited in the present embodiment.

Referring to FIG. 1-FIG. 3 in combination, in the present embodiment, the bottom of the vacuum chamber 1 is in communication with one end of the vacuum pipe 77, the other end of the vacuum pipe 77 is connected to a vacuumizing device 78, and the sealed vacuum chamber 1 can be vacuumized by operating the vacuumizing device 78.

In an embodiment of the present disclosure, an ALD processing apparatus is provided.

Referring to FIG. 3 and FIG. 6 in combination, the processing apparatus in the present embodiment further includes a first heater 17, a second heater 18, and a third heater 19, wherein the first heater 17 is provided on a top of the sealing cover 5, and an output end of the first heater 17 acts on the sealing cover 5; the second heater 18 is provided between an outer side wall of the reaction chamber 2 and an inner side wall of the vacuum chamber 1, and an output end of the second heater 18 acts on a side wall of the reaction chamber 2; and the third heater 19 is provided between the bottom of the reaction chamber 2 and the bottom of the vacuum chamber 1, and the third heater 19 acts on the bottom of the reaction chamber 2.

In the present embodiment, as the output end of the first heater 17 acts on the sealing cover 5, the output end of the second heater 18 acts on the side wall of the reaction chamber 2, and the third heater 19 acts on the bottom of the reaction chamber 2, independent radiant heating and temperature control can be realized in three areas, i.e., the top, the side, and the bottom of the reaction chamber 2, and a uniform temperature field is formed in a large space, so that the heating temperature of the precursor source is rapidly increased to a required temperature, and the heating efficiency is high.

Specifically in the present embodiment, parameters of the first heater 17 may be 380 V, 700° C., and power of 3.5 KW, parameters of the second heater 18 are 380 V, 700° C., and power of 6 KW, and parameters of the third heater 19 are 380 V, 700° C., and power of 5 KW. Definitely, the parameters of each heater may also be selected according to requirements, which is not limited in the present embodiment.

Referring to FIG. 3 and FIG. 6 in combination, in the present embodiment, a first mounting plate 20 is fixedly provided on the top of the sealing cover 5, the first heater 17 includes a plurality of first heating wires, the plurality of first heating wires are arranged in concentric corrugations, and the plurality of first heating wires are all fixed on a bottom surface of the first mounting plate 20.

In the present embodiment, two opposite supporting blocks 21 are provided on the top of the sealing cover 5, and the two supporting blocks 21 can be symmetrically arranged with respect to a centerline of the sealing cover 5 in the first direction. The first mounting plate 20 is assembled on the two supporting blocks 21 by means of welding or screws, and the plurality of first heating wires of the first heater 17 can be assembled on the bottom surface of the first mounting plate 20 by means of welding or embedding, which is not limited in the present embodiment.

Referring to FIG. 3 and FIG. 6 in combination, in the present embodiment, an outer edge of the first mounting plate 20 is bent downwards to form a first limiting stop edge 22, and the first limiting stop edge 22 can limit a heating direction of the first heater 17 to a certain extent, so as to further improve the heating efficiency of the first heater 17.

Referring to FIG. 3 and FIG. 6 in combination, the processing apparatus in the present embodiment further includes a first heat reflection assembly 23, wherein the first heat reflection assembly 23 is fixedly arranged on a top surface of the first mounting plate 20, and the first heat reflection assembly 23 is configured to reflect heat in the operation of the first heater 17 to the sealing cover 5, so as to further improve a heating rate of the precursor source.

Referring to FIG. 3 and FIG. 6 in combination, in the present embodiment, a fixing block 24 is provided on the top surface of the first mounting plate 20, and the first heat reflection assembly 23 is provided between the first mounting plate 20 and the fixing block 24, that is, the first heat reflection assembly 23 can be assembled on the first mounting plate 20.

Referring to FIG. 3 and FIG. 6 in combination, in the present embodiment, a second mounting plate 25 is provided between the outer side wall of the reaction chamber 2 and an inner side wall of the vacuum chamber 1, two ends of a circumferential surface of the second mounting plate 25 are closed rings, and the second mounting plate 25 is fixedly provided on a top surface of the bottom of the vacuum chamber 1. The second heater 18 includes a plurality of second heating wires, all the second heating wires are coaxially arranged in a ring shape, each second heating wire is fixedly provided on the inner side wall of the second mounting plate 25 in a vertical direction, and each second heating wire is sleeved on the outer side wall of the reaction chamber 2, so as to heat the side wall of the reaction chamber 2.

Referring to FIG. 3 and FIG. 6 in combination, in the present embodiment, both of two ends of the second mounting plate 25 are turned inwards to form second limiting stop edges 26, and the second limiting stop edges 26 can limit a heating direction of the second heater 18 to a certain extent, so as to further improve the heating efficiency of the second heater 18.

Referring to FIG. 3 and FIG. 6 in combination, in the present embodiment, the top surface of the bottom of the vacuum chamber 1 is provided with an annular groove 27, the annular groove 27 is arranged between the vacuum chamber 1 and the reaction chamber 2, and the second limiting stop edges 6 at lower ends of the second mounting plate 25 can be fixed in the annular groove 27 by means of welding or bolting, that is, the second mounting plate 25 can be assembled in the vacuum chamber 1.

Referring to FIG. 3 and FIG. 6 in combination, the processing apparatus in the present embodiment further includes a second heat reflection assembly 28, wherein the second heat reflection assembly 28 is fixedly arranged on an outer side surface of the second mounting plate 25, and the second heat reflection assembly 28 is configured to reflect heat in the operation of the second heater 18 to the side wall of the reaction chamber 2, so as to further improve the heating rate of the precursor source.

Referring to FIG. 3 and FIG. 6 in combination, the processing apparatus in the present embodiment further includes a third mounting plate 29, wherein the third mounting plate 29 is fixedly provided between the second mounting plate 25 and an inner wall of the vacuum chamber 1, the third mounting plate 29 is in a closed loop, and the second heat reflection assembly 28 is provided between the third mounting plate 29 and the second mounting plate 25, so as to realize assembling of the second heat reflection assembly 28 between the vacuum chamber 1 and the reaction chamber 2.

In the present embodiment, a lower end of the third mounting plate 29 can be fixedly attached to a side wall of the annular groove 27, and a lower end of the second heat reflection assembly 28 is located in the annular groove 27.

Referring to FIG. 3 and FIG. 6 in combination, the processing apparatus in the present embodiment further includes a third heat reflection assembly 30, wherein the third heat reflection assembly 30 is fixedly provided on an outer side surface of the third mounting plate 29, and the third heat reflection assembly 30 and the second heat reflection assembly 28 function together, so as to reflect heat in the operation of the second heater 18 to the side wall of the reaction chamber 2, thus further improving the heating rate of the precursor source.

Referring to FIG. 3 and FIG. 6 in combination, in the present embodiment, a first step 31 is provided on the top surface of the bottom of the vacuum chamber 1, the first step 31 is located outside the annular groove 27, and the bottom of the third heat reflection assembly 30 is fixed on the first step 31, so as to realize assembling of the third heat reflection assembly 30 in the vacuum chamber 1.

Referring to FIG. 3 and FIG. 6 in combination, in the present embodiment, a fourth mounting plate 32 is provided between the bottom of the reaction chamber 2 and the bottom of the vacuum chamber 1, and the third heater 19 includes a plurality of third heating wires, wherein the plurality of third heating wires are arranged in concentric corrugations, and the plurality of third heating wires are all fixed on a top surface of the fourth mounting plate 32.

Referring to FIG. 3 and FIG. 6 in combination, in the present embodiment, an outer edge of the fourth mounting plate 32 is bent upwards to form a third limiting stop edge 33, and the third limiting stop edge 33 can limit a heating direction of the third heater 19 to a certain extent, so as to further improve the heating efficiency of the third heater 19.

Referring to FIG. 3 and FIG. 6 in combination, the processing apparatus in the present embodiment further includes a fourth heat reflection assembly 34, wherein the fourth heat reflection assembly 34 is fixedly provided on a bottom surface of the fourth mounting plate 32, and the fourth heat reflection assembly 34 is configured to reflect heat in the operation of the third heater 19 onto the bottom of the reaction chamber 2, so as to further improve the heating rate of the precursor source.

Referring to FIG. 3 and FIG. 6 in combination, in the present embodiment, two stages of second steps 35 are vertically provided in sequence on a circumferential surface of each connection block 12, wherein the fourth mounting plate 32 is fixedly provided on the second step 35 located above, and the fourth heat reflection assembly 34 is fixedly provided between the second step 32 located below and the fourth mounting plate 34, that is, the fourth mounting plate 32 and the fourth heat reflection assembly 34 can be assembled in the vacuum chamber 1.

In the present embodiment, each of the first heat reflection assembly 23, the second heat reflection assembly 28, the third heat reflection assembly 30, and the fourth heat reflection assembly 34 includes several heat reflecting plates arranged in sequence, and two adjacent heat reflecting plates contact in a form of multi-point contact, which has characteristics of having high heat reflection efficiency, saving energy, and improving uniformity of the temperature field.

A thickness of each heat reflecting plate in the present embodiment may be 0.04-1 mm, and a distance between every two adjacent heat reflecting plates is 0.05-0.1 mm, so as to reduce a space dimension.

In the present embodiment, each heat reflection assembly can be used to limit the heating direction of a corresponding heater, so as to only heat the reaction chamber 2, while the temperature of the vacuum chamber 1 can be maintained at a normal temperature, without the need of cooling the vacuum chamber 1 by a cooling facility such as water cooling, thereby simplifying the structure and having very good practicability.

In an embodiment of the present disclosure, an ALD processing apparatus is provided.

Since the first heater 17 in the present embodiment is arranged on the top of the sealing cover 5, and the sealing cover 5 is connected to the lifting device b, in addition, after the substrate is transported into the reaction chamber 2, the vacuum chamber 1 needs to be vacuumized, how to ensure the sealing performance of the vacuum chamber during the ALD processing, without interfering with operation of a heating assembly on the top of the sealing cover 5 and a thermocouple for measuring the temperature on the top of the sealing cover, is a technical problem that needs to be solved urgently.

On this basis, the present embodiment provides a thermocouple mounting mechanism, so as to solve the above problem.

Figure 7:
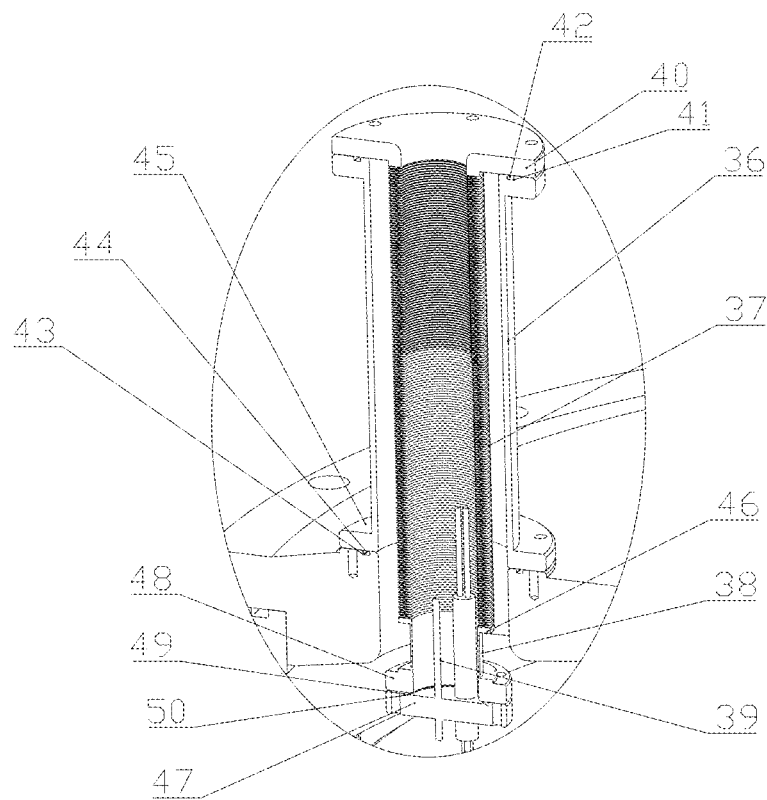
FIG. 7 is a structural schematic diagram of a thermocouple mounting mechanism.

FIG. 7 is a structural schematic diagram of the thermocouple mounting mechanism, and referring to FIG. 6 and FIG. 7 in combination, the thermocouple mounting mechanism in the present embodiment includes a fixed sleeve 36, a first corrugated pipe 37, and a connecting sleeve 38.

Referring to FIG. 1, FIG. 2, and FIG. 7 in combination, in the present embodiment, the fixed sleeve 36 is fixedly provided on the top surface of the vacuum chamber 1, an upper end of the first corrugated pipe 37 is fixedly connected to a top of an inner wall of the fixed sleeve 36, and a lower end of the first corrugated pipe 37 passes through a lower end of the fixed sleeve 36 and the top of the vacuum chamber 1 in a movable manner in sequence, wherein the lower end of the first corrugated pipe 37 is located in the vacuum chamber 1, the connecting sleeve 38 is fixedly provided in the vacuum chamber 1, and the lower end of the first corrugated pipe 37 is connected to a top surface of the connecting sleeve 38. A thermocouple 39 is connected to the first heater 17, the second heater 18, and the third heater 19 respectively, and the thermocouple 39 for measuring a temperature on the top of the sealing cover and a heating wire on the top of the sealing cover 5 are both fixedly provided in the connecting sleeve 38.

When the first heater 17 is lifted up and down along with the sealing cover 5, the connecting sleeve 38 is lifted up and down therewith, and drives the first corrugated pipe 37 to stretch and contract in the fixed sleeve 36. Since two ends of the first corrugated pipe 37 are connected to the fixed sleeve 36 and the connecting sleeve 38, the first corrugated pipe 37 and the fixed sleeve 36 are sealed, and the inside of the first corrugated pipe 37 is in communication with the outside, so that the sealing performance of the vacuum chamber during the ALD processing can be ensured, without interfering with the operation of the heating assembly on the top of the sealing cover and the thermocouple for measuring the temperature on the top of the sealing cover, which has very good practicability.

Referring to FIG. 6 and FIG. 7 in combination, in the present embodiment, the top of the fixed sleeve 36 is provided with a first connecting flange 40, wherein the first connecting flange 40 is annular, an inner side of the first connecting flange 40 protrudes from the inner wall of the fixed sleeve 36, and the upper end of the first corrugated pipe 37 is connected to the inner side of the first connecting flange 40, so as to realize assembling of the upper end of the first corrugated pipe 37 onto the fixed sleeve 36.

Referring to FIG. 6 and FIG. 7 in combination, in the present embodiment, a first sealing groove 41 is provided on the top of the fixed sleeve 36, wherein a first sealing ring 42 is provided in the first sealing groove 41, and the first connecting flange 40 is provided on and covers the first sealing groove 41, so as to improve the sealing performance between the fixed sleeve 36 and the first connecting flange 40.

In the present embodiment, the first connecting flange 40 can be assembled on the top of the fixed sleeve 36 by means of bolting, so as to facilitate replacement and maintenance of the first sealing ring 42.

Referring to FIG. 6 and FIG. 7 in combination, in the present embodiment, a second sealing groove 43 is provided on the top surface of the vacuum chamber 1, wherein a second sealing ring 44 is provided in the second sealing groove 43, a second connecting flange 45 is provided on the bottom of the fixed sleeve 36, and the second connecting flange 45 is provided on and covers the second sealing groove 43, so as to improve the sealing performance between the fixed sleeve 36 and the top of the vacuum chamber 1.

In the present embodiment, the second connecting flange 45 can be assembled on the top of the vacuum chamber 1 by means of bolting, so as to facilitate replacement and maintenance of the second sealing ring 42.

Referring to FIG. 6 and FIG. 7 in combination, in the present embodiment, the top of the connecting sleeve 38 is provided with a third connecting flange 40, and the lower end of the first corrugated pipe 37 is connected to a top of the third connecting flange 46, so as to connect and assemble the first corrugated pipe 37 and the connecting sleeve 38.

In the present embodiment, the top of the connecting sleeve 38 can be welded or integrally molded with the third connecting flange 46, so as to improve the sealing effect.

Referring to FIG. 6 and FIG. 7 in combination, in the present embodiment, the inside of the connecting sleeve 38 is sealed by a connecting cover plate 47, wherein three thermocouples 39 are all provided on the connecting cover plate 47, and a heating wire of the heating assembly provided on the top of the sealing cover 5 and the thermocouple 39 for measuring the temperature on the top of the sealing cover 5 both pass through the connecting cover plate 47 in a sealed manner, so as to realize the assembling of the heating wire of the heating assembly on the top of the sealing cover 5 and the thermocouple 39 for measuring the temperature on the top of the sealing cover 5.

Referring to FIG. 6 and FIG. 7 in combination, in the present embodiment, the bottom of the connecting sleeve 38 is provided with a fourth connecting flange 48, and the fourth connecting flange 48 is fixedly connected to the connecting cover plate 47, so as to achieve the assembling of the connecting sleeve 38 and the connecting cover plate 47.

In the present embodiment, the bottom of the connecting sleeve 38 and the fourth connecting flange 48 may be integrally molded, so as to improve the sealing performance between the two.

Referring to FIG. 6 and FIG. 7 in combination, in the present embodiment, a third sealing groove 49 is provided on the top of the connecting cover plate 47, a third sealing ring 50 is provided in the third sealing groove 49, and the fourth connecting flange 48 is provided in the third sealing groove 49, so as to improve the sealing performance between the fourth connecting flange 48 and the connecting cover plate 47.

In the present embodiment, the fourth connecting flange 48 can be assembled on the connecting cover plate 47 by means of bolting, so as to facilitate replacement and maintenance of the third sealing ring 50.

It should be noted that, heating wires of the second heating assembly and the third heating assembly and heating wires for testing the side wall of the reaction chamber and the bottom of the reaction chamber may directly pass through the side wall of the vacuum chamber and the bottom of the vacuum chamber, which is not limited in the present embodiment.

In an embodiment of the present disclosure, an ALD processing apparatus is provided.

With reference to FIG. 3, in the present embodiment, a first stopper 51 is provided at an edge of the bottom of the sealing cover 5, a boss 52 is provided at opening on the top of the reaction chamber 2, and when the sealing cover 5 seals the opening on the top of the reaction chamber 2, the boss 52 can be embedded into the first stopper 51, so as to improve the sealing effect of the reaction chamber 2.

Definitely, in the present embodiment, the edge of the sealing cover 5 and the top of the reaction chamber 2 also may be in planar contact, which is not limited in the present embodiment.

Figure 8:
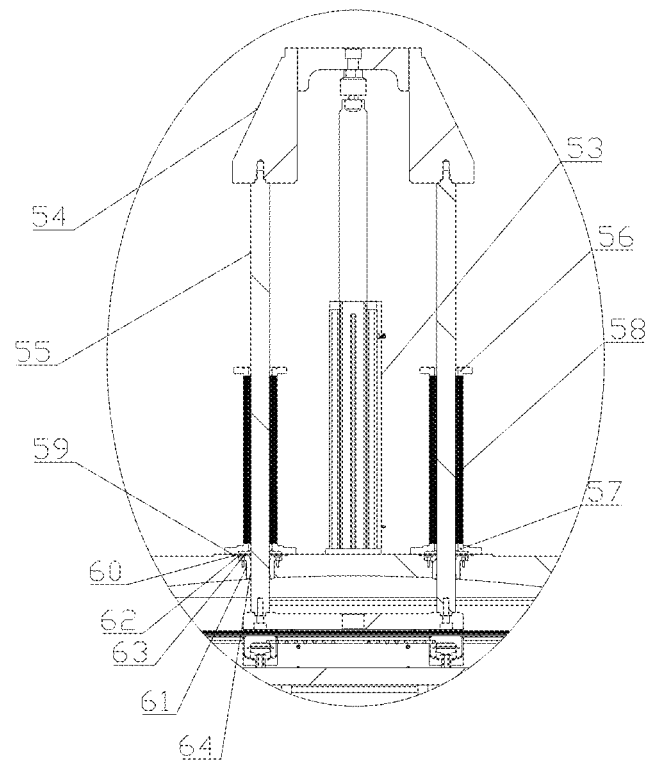
FIG. 8 is a structural schematic diagram of a lifting device in FIG. 1.

FIG. 8 is a structural schematic diagram of the lifting device in FIG. 1. Referring to FIG. 1, FIG. 2, FIG. 3, and FIG. 8 in combination, the lifting device b in the present embodiment includes a lifting unit 53, a connecting frame 54, and a connecting rod 55, wherein the lifting unit 53 is fixedly provided on the top of the vacuum chamber 1, an output end of the lifting unit 53 stretches and contracts vertically, the connecting frame 54 is located above the vacuum chamber 1, the connecting frame 54 is connected with the output end of the lifting unit 53, that is, the connecting frame 54 can be synchronously lifted up and down with the output end of the lifting unit 53, and an upper end of the connecting rod 55 is fixedly connected with the connecting frame 54, a lower end of the connecting rod 55 passes through the top of the vacuum chamber 1 in a sealed manner, and the sealing cover 5 is fixedly provided on the lower end of the connecting rod 55. By operating the lifting unit 53, the sealing cover 5 can be driven to be lifted up and down to further open or close the reaction chamber 2.

With reference to FIG. 1, specifically in the present embodiment, there may be two lifting units 53 provided opposite to each other, two connecting rods 55 are provided opposite to each other, a connecting line of the two lifting units 53 is located on a perpendicular bisector of a connecting line of the two connecting rods 55, wherein synchronous operation of the two lifting units 53 can drive the two connecting rods 55 to be synchronously lifted up and down, so that force on the sealing cover 5 during moving is more balanced, and the lifting of the sealing cover 5 is more stable.

Referring to FIG. 2, FIG. 3, and FIG. 8 in combination, since the connecting rod 55 passes through the top surface of the vacuum chamber 1, in order to ensure the sealing performance of the vacuum chamber 1, each connecting rod 55 in the present embodiment is provided with a sealing device, and each sealing device includes a first sleeve 56, a second sleeve 57, and a second corrugated pipe 58, wherein the first sleeve 56 is fixedly provided on a circumferential surface of the connecting rod 55, and the first sleeve 54 is located above the vacuum chamber 1, the second sleeve 57 is fixedly arranged on the top surface of the top of the vacuum chamber 1, and the other end of the connecting rod 55 movably passes through the second sleeve 57 in a movable manner, so as to enter the vacuum chamber 1. The first sleeve 56 and the second sleeve 57 are connected through the second corrugated pipe 58, the second corrugated pipe 58 is sleeved on the circumferential surface of the connecting rod 55, wherein when the connecting rod 55 is lifted up and down, the second corrugated pipe 58 can be driven to stretch and contract, so as to ensure the sealing performance of the vacuum chamber 1.

Referring to FIG. 3 and FIG. 8 in combination, in the present embodiment, a fourth sealing groove 60 is provided on the top surface of the top of the vacuum chamber 1, a bottom of the second sleeve 57 is provided on and covers the fourth sealing groove 60, and a fourth sealing ring 59 is provided in the fourth sealing groove 60.

With reference to FIG. 3 and FIG. 8 in combination, in the present embodiment, a through hole for the connecting rod 55 to pass through is provided on the top of the vacuum chamber 1, wherein the through hole is provided inside the fourth sealing groove 60, a guide sleeve 61 is provided in the through hole, and the connecting rod 55 passes through the guide sleeve 61 in a sliding fit manner. The guide sleeve 61 can improve smoothness of the sliding of the connecting rod 55, and can reduce wear on the through hole and improve the service lifetime.

With reference to FIG. 3 and FIG. 8 in combination, in the present embodiment, a top surface of the through hole is provided with a second stopper 62, a guide cap 63 is provided on a top of the guide sleeve 61, and the guide cap 63 can be fixedly provided on the second stopper 62 by means of bolting, so as to realize assembling of the guide sleeve 61 in the through hole, and facilitate the replacement of the guide sleeve 61.

With reference to FIG. 8, in the present embodiment, each of two axial ends of an inner wall of the guide sleeve 61 is provided with a notch 64, so as to facilitate the assembling of the connecting rod 55 in the guide sleeve 61.

With reference to FIG. 8, in the present embodiment, lower ends of the two connecting rods 55 can be connected to the fixing block 24 by means of bolting, so as to achieve the assembling of the connecting rods 55 with the sealing cover 5.

It should be noted that the lifting unit 53 in the present embodiment may be a mechanism linearly moving back and forth, for example, a ball screw or a linear guide rail, preferably an air cylinder, with a characteristic of quick response.

In an embodiment of the present disclosure, an ALD processing apparatus is provided.

The present embodiment discloses a grabbing device d configured to grab the substrate transported by the transporting device.

Figure 9:
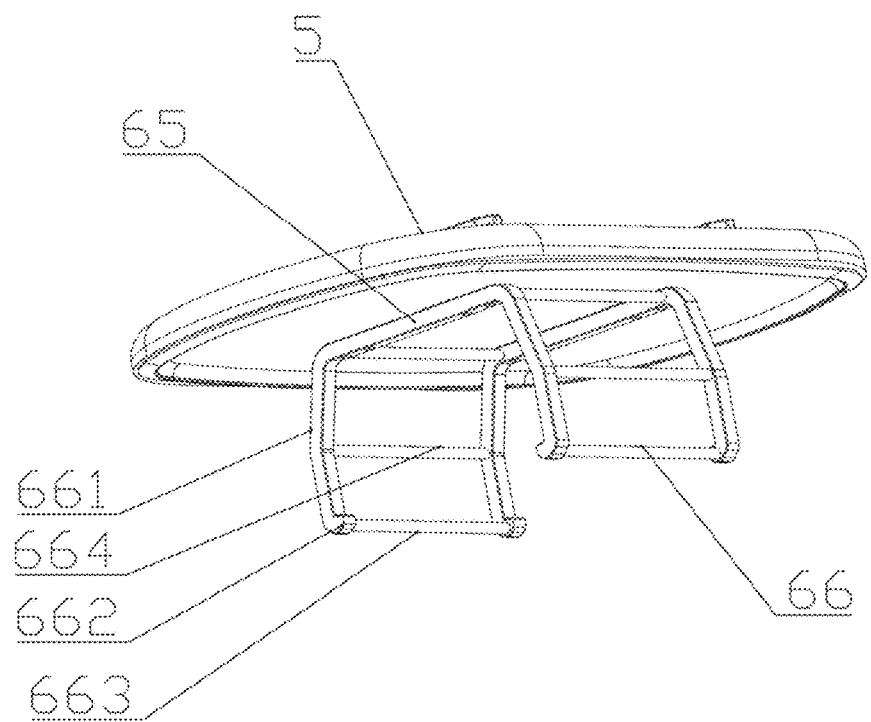
FIG. 9 is a schematic diagram of structural arrangement of a grabbing device.

FIG. 9 is a schematic diagram of structural arrangement of the grabbing device. Referring to FIG. 2, FIG. 3, and FIG. 9 in combination, the grabbing device in the present embodiment includes a frame 65 and a gripper 66, wherein the frame 65 can be fixedly provided on the bottom of the sealing cover 5 by means of welding or bolting, wherein two grippers 66 are provided opposite to each other, the two grippers 66 are arranged opposite to each other along a second direction, each gripper 66 includes two connecting arms 661 and a supporting arm 662, each of the upper ends of the two connecting arms 661 is fixedly connected to an end of the frame 65 in a first direction, and each of the lower ends of the two connecting arms 661 is provided with a connecting projection 663 extending in a direction towards the other gripper, the two connecting projections 663 are connected through the supporting arm 662, the transporting device c can transport the substrate onto the supporting arms 662 of the two grippers 66, subsequently, the transporting device c is returned, the substrate is transferred onto the supporting arms 662 of the two grippers 66, then the lifting device b is operated, and the substrate is lowered along with the sealing cover 5 into the reaction chamber 2.

With reference to FIG. 9, in the present embodiment, middle portions of the two connecting arms 661 are also connected by a reinforcing arm 664, so as to improve connection strength of the grippers 66.

In the present embodiment, various members forming each gripper 66 can be connected by welding.

In an embodiment of the present disclosure, an ALD processing apparatus is provided.

With reference to FIG. 1 and FIG. 2 in combination, in the present embodiment, a detachable enclosing plate 67 is further provided at two sides of a vacuum chamber 1 in a first direction, the enclosing plate 67 can be connected to the vacuum chamber 1 by means of bolting or the like, and when the enclosing plate 67 is detached, members in the vacuum chamber 1 can be maintained and cleaned.

The enclosing plate 67 in the present embodiment is made of a transparent material, so as to facilitate observing the members in the vacuum chamber 1.

In an embodiment of the present disclosure, an ALD processing apparatus is provided.

The present embodiment discloses a transporting device c of the ALD processing apparatus.

Figure 10:
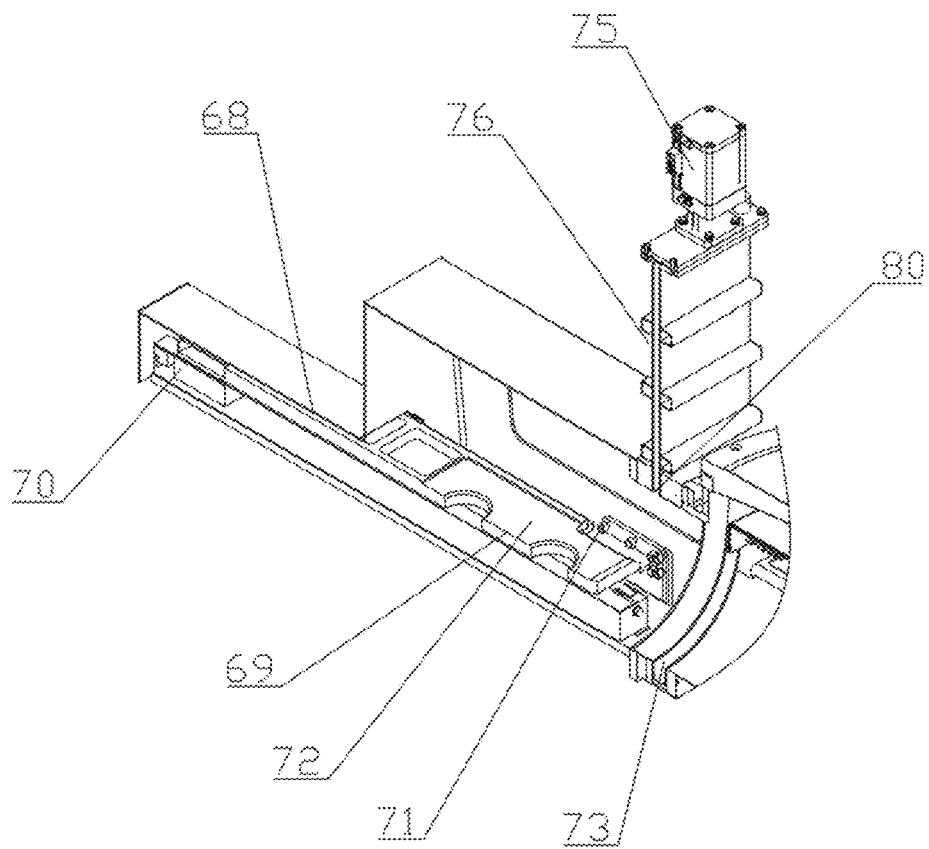
FIG. 10 is a schematic diagram of structural arrangement of a transporting device.

FIG. 10 is a schematic diagram of structural arrangement of the transporting device. Referring to FIG. 1, FIG. 2, and FIG. 10 in combination, the transporting device c in the present embodiment includes a transporting chamber 68 and a transporting plate 69, wherein the transporting chamber 68 is arranged on one side of a vacuum chamber 1 in a second direction, and the transporting chamber 68 is operably in communication with the vacuum chamber 1; the transporting plate 69 is provided in the transporting chamber 68, the transporting plate 69 operably enters the vacuum chamber 1, the transporting plate 69 is provided above a reaction chamber 2, after a substrate is transported on the transporting plate 69 into the vacuum chamber 1 and then falls onto the grippers 66 of the grabbing device d, the transporting plate 69 returns to an original position.

With reference to FIG. 10, in the present embodiment, a first driving unit 70 is provided in the transporting chamber 68, an output end of the first driving unit 70 can linearly move back and forth, and the transporting plate 69 is fixedly connected to an output end of the first driving unit 70.

It should be noted that the first driving unit 70 in the present embodiment may be a mechanism linearly moving back forth, such as a ball screw or a linear guide rail, preferably an air cylinder, with a characteristic of quick response.

With reference to FIG. 10, in the present embodiment, two guide assemblies are vertically provided on each of two side walls of the transporting chamber 68 in the second direction, each guide assembly includes a plurality of rollers 71 spaced apart in the second direction, and the rollers 71 are rotatably connected to the side wall of the transporting chamber 68 in the second direction, wherein two sides of the transporting plate 69 in the second direction are respectively provided between two guide assemblies, and when the transporting plate 69 moves, the transporting plate 69 can roll between the rollers 71 of the two guide assemblies, so as to guide a moving direction of the transporting plate 69.

Figure 11:
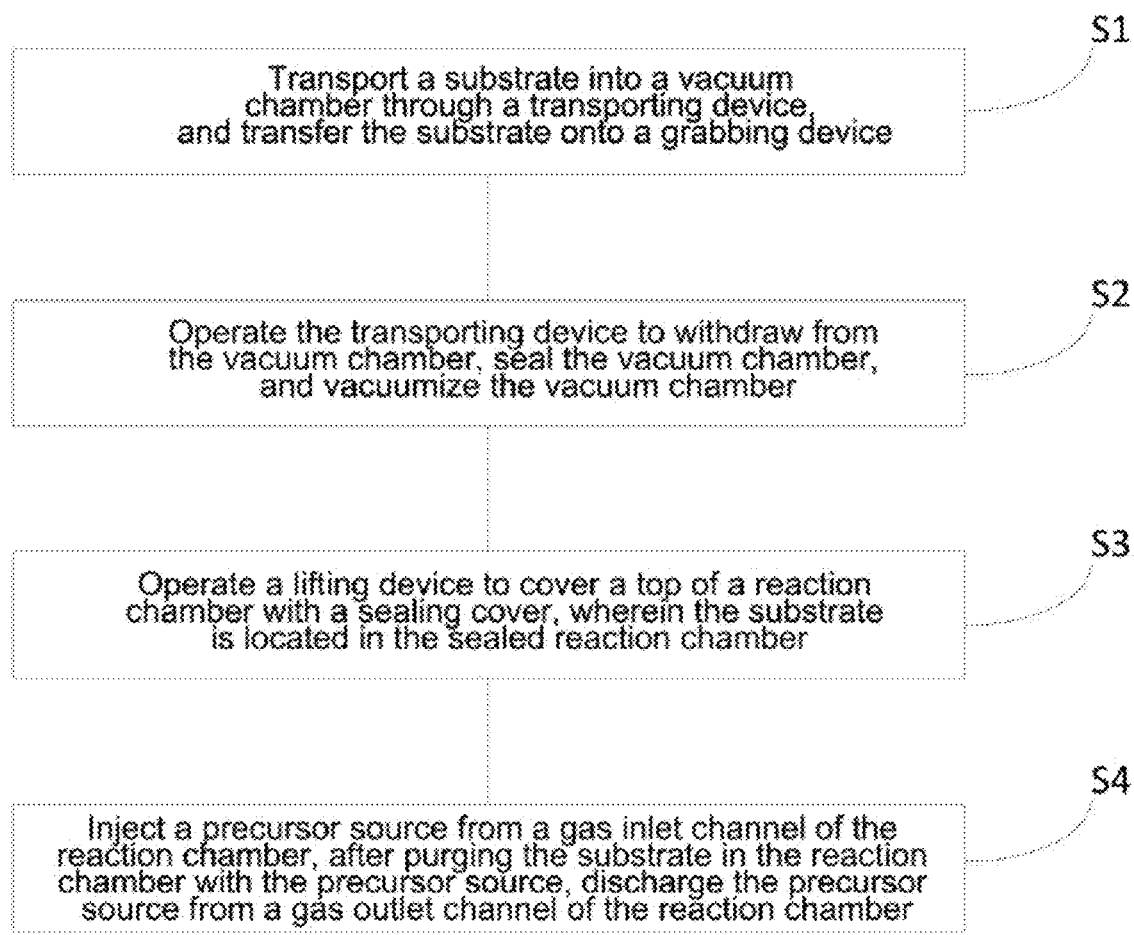
FIG. 11 is a schematic flowchart of an ALD processing method according to one or more embodiments disclosed.

With reference to FIG. 11, in the present embodiment, a transporting groove 72 may be provided on a top surface of the transporting plate 69, a plurality of substrates can be placed on a supporting frame, and the supporting frame is provided on the transporting groove 72, so that the transportation operation of the plurality of substrates can be completed at one time, which is suitable for batch production and processing of products.

In an embodiment of the present disclosure, since the transporting plate 69 needs to enter the vacuum chamber 1, but the vacuum chamber 1 needs to ensure to be sealed so as to perform vacuumizing, on this basis, in the present embodiment, a sealing door 80 that can be opened is provided at one side of the vacuum chamber 1 in the second direction, and when the transporting plate needs to be moved into the vacuum chamber 1, the sealing door is opened, and after the transporting plate 69 returns, the sealing door is closed.

With reference to FIG. 10, in the present embodiment, a slot 73 is provided at a joint between the vacuum chamber 1 and the transporting chamber 68, the slot 73 is open at the top, and the sealing door 80 is operably inserted into the slot 73, so as to seal one side of the vacuum chamber 1 in the second direction.

With reference to FIG. 1, FIG. 2, FIG. 3, and FIG. 10 in combination, in the present embodiment, a supporting frame 74 is provided on the vacuum chamber 1, wherein a second driving mechanism 74 is provided on the supporting frame 74, an output end of the second driving mechanism 74 vertically moves back and forth, the sealing door 80 is connected to the output end of the second driving mechanism 74, and the sealing door 80 can open or seal one side of the vacuum chamber 1 in the second direction by operating the second driving mechanism 74.

It should be noted that the second driving unit 75 in the present embodiment may be a mechanism linearly moving back and forth, such as a ball screw or a linear guide rail, preferably an air cylinder, with a characteristic of quick response.

With reference to FIG. 10, in the present embodiment, the supporting frame includes two butt-jointed connecting plates 76, the two connecting plates 76 are butt-jointed to form a sealed chamber, the second driving mechanism 74 is fixedly provided on the top of the sealed chamber, a bottom of the sealed chamber is open, wherein a dimension of the sealed chamber in a width direction is consistent with a thickness of the sealing door 80, and the sealing door 80 moves in the sealed chamber 1.

In an embodiment of the present disclosure, an ALD processing method is disclosed, and this processing method is carried out based on the ALD processing apparatus in the above embodiments.

FIG. 11 is a schematic flowchart of the ALD processing method according to one or more embodiments disclosed, and this processing method includes:

S1: transporting a substrate into a vacuum chamber 1 through a transporting device c, and transferring the substrate onto a grabbing device d;

S2: operating the transporting device c to withdraw from the vacuum chamber 1, sealing the vacuum chamber 1, and vacuumizing the vacuum chamber 1;

S3: operating a lifting device b to cover a top of a reaction chamber 2 with a sealing cover 5, wherein the substrate is located in the sealed reaction chamber 2; and S4: injecting a precursor source from a gas inlet channel of the reaction chamber 2, after purging the substrate in the reaction chamber 2 with the precursor source, discharging the precursor source from a gas outlet channel of the reaction chamber 2, thus completing the ALD processing of the substrate.

In the present embodiment, S3 further includes heating the reaction chamber 2, wherein a heating temperature can be set according to processing requirements, which is not limited in the present embodiment.

S4 in the present embodiment specifically includes:

the precursor source is injected from the gas inlet channel of the reaction chamber 2 into the reaction chamber 2 in sequential and alternate pulse, wherein the precursor source sequentially and alternately undergoes a chemisorption reaction on the surface of the substrate in the reaction chamber 2, and after the purging is completed, residual precursor source and reaction by-products are discharged from the gas outlet channel of the reaction chamber 2, and the above process of introducing the precursor source in sequential pulse is repeated to complete the surface self-limiting chemisorption reaction, and a film layer with a precise thickness is obtained by controlling repeating times, thus completing the ALD processing of the substrate.

Finally, it should be noted that the above embodiments are merely used for illustrating the technical solutions of the present disclosure, rather than limiting the present disclosure, although the detailed description is made to the present disclosure with reference to examples, those ordinarily skilled in the art should understand that they still could make modifications or equivalent substitutions to the technical solutions in the present disclosure, without departing from the spirit and scope of the technical solution of the present disclosure, and the modifications or equivalent substitutions should be all covered within the scope of the claims of the present disclosure.

INDUSTRIAL APPLICABILITY

The ALD processing apparatus provided in the embodiments of the present disclosure avoids the risk of leakage of the precursor source at the joint, which not only can reduce the volume of the reaction chamber, but also can increase the length of uniform gas flow, and improve the uniformity of gas flow, so as to reduce the phenomenon of turbulent flow, which can ensure that the precursor source covers the entire substrate comprehensively and make the precursor source contact the substrate evenly, the uniformity of the deposition film is improved, so as to ensure the molding quality and consistency of the deposition film. The film-forming efficiency is high, the cycle is short, the utilization rate of the precursor source is improved, and it is suitable for batch production, with a very good practical value.

What is claimed is:

1. An ALD processing apparatus, comprising:
   a reactor, wherein the reactor comprises a vacuum chamber and a reaction chamber, the reaction chamber is built in the vacuum chamber, the reaction chamber is open at a top, and a bottom of the reaction chamber is formed with a gas inlet channel and a gas outlet channel, wherein the gas inlet channel and the gas outlet channel are formed opposite to each other with respect to a centerline of the bottom of the reaction chamber in a first direction;
   a lifting device, wherein the lifting device is provided on the reactor, an output end of the lifting device stretches and contracts vertically, the output end of the lifting device is provided with a sealing cover, and the sealing cover operably seals the top of the reaction chamber;
   a transporting device, wherein the transporting device is configured to transport a substrate into the vacuum chamber; and
   a grabbing device, wherein the grabbing device is provided on the sealing cover, and the grabbing device is configured to grab the substrate transported into the vacuum chamber,
   wherein a transferring chamber is fixedly provided at the bottom of the reaction chamber, the transferring chamber is open at a top, the bottom of the reaction chamber is provided on and covers the top of the transferring chamber, and two partition plates are provided in the transferring chamber, wherein the two partition plates divide the transferring chamber into a first chamber, a second chamber, and a third chamber that are sequentially arranged along a second direction, the gas inlet channel is in communication with the first chamber, and the gas outlet channel is in communication with the third chamber, wherein a bottom of the first chamber is formed with a gas inlet main hole, and a bottom of the third chamber is formed with a gas outlet main hole.

2. The ALD processing apparatus according to claim 1, wherein the gas inlet channel is hole-shaped, a plurality of the gas inlet channels are provided, and a plurality of the gas inlet channels are formed on one side of the bottom of the reaction chamber; and
   the gas outlet channel is hole-shaped, a plurality of the gas outlet channels are also formed, and a plurality of the gas outlet channels are formed on the other side of the bottom of the reaction chamber.

3. The ALD processing apparatus according to claim 2, wherein multiple sets of the gas inlet channels are formed, and the multiple sets of the gas inlet channels are formed in sequence along a second direction, each set of the gas inlet channels is arc-shaped, and an aperture of each gas inlet channel of each set of the gas inlet channels is gradually reduced in a direction towards the centerline of the bottom of the reaction chamber in the first direction; and
   multiple sets of the gas outlet channels are formed, the multiple sets of the gas outlet channels are formed in sequence along the second direction, each set of the gas outlet channels is arc-shaped, and an aperture of each gas outlet channel of each set of the gas outlet channels is gradually reduced in a direction towards the centerline of the bottom of the reaction chamber in the first direction.

4. The ALD processing apparatus according to claim 1, wherein the gas inlet channel is strip-shaped, a plurality of the gas inlet channels are formed, and a plurality of the gas inlet channels are formed on one side of the bottom of the reaction chamber; and the gas outlet channel is strip-shaped, a plurality of the gas outlet channels are also formed, and a plurality of the gas outlet channels are formed on the other side of the bottom of the reaction chamber.

5. The ALD processing apparatus according to claim 4, wherein a dimension of the gas inlet channel in a second direction is gradually reduced in a direction towards the centerline of the bottom of the reaction chamber in the first direction; and a dimension of the gas outlet channel in the second direction is gradually reduced in the direction towards the centerline of the bottom of the reaction chamber in the first direction.

6. The ALD processing apparatus according to claim 1, wherein two gas homogenizing plates are provided in the reaction chamber, the two gas homogenizing plates are provided opposite to each other with respect to the centerline of the bottom of the reaction chamber in the first direction, and the two gas homogenizing plates are provided between the gas inlet channel and the gas outlet channel, the two gas homogenizing plates divide the reaction chamber into a gas inlet chamber, a reaction main chamber, and a gas outlet chamber sequentially arranged along a second direction, and the gas homogenizing plates are each provided with a plurality of via holes.

7. The ALD processing apparatus according to claim 1, wherein the two partition plates are provided between the gas inlet channel and the gas outlet channel, the gas inlet main hole is formed between the gas inlet channel and the partition plate on the same side, and the gas outlet main hole is formed between the gas outlet channel and the partition plate on the same side, wherein the gas inlet main hole and the gas outlet main hole are formed opposite to each other with respect to the centerline of the bottom of the reaction chamber in the first direction.

8. The ALD processing apparatus according to claim 1, wherein two opposite projections are provided at a bottom of the transferring chamber; and two opposite connection blocks are provided between the bottom of the transferring chamber and a bottom of the vacuum chamber, a positioning groove is provided on a top of each of the connection blocks, and the projections are fixedly embedded in corresponding positioning grooves of the connection blocks.

9. The ALD processing apparatus according to claim 8, wherein the two protrusions are provided at bottoms of the gas inlet main hole and the gas outlet main hole respectively; and the processing apparatus further comprises a gas inlet pipe and a gas outlet pipe, wherein one end of the gas inlet pipe passes through the bottom of the vacuum chamber, and the connection block and the protrusion located at the bottom of the gas inlet main hole in sequence, one end of the gas inlet pipe is in communication with the gas inlet main hole, and the other end of the gas inlet pipe is configured to be in communication with a gas inlet device; and one end of the gas outlet pipe passes through the bottom of the vacuum chamber, and the connection block and the protrusion located at the bottom of the gas outlet main hole in sequence, one end of the gas outlet pipe is in communication with the gas outlet main hole, and the other end of the gas outlet pipe is configured to be in communication with a gas outlet device.

10. The ALD processing apparatus according to claim 1, wherein the processing apparatus further comprises:

a first heater, wherein the first heater is provided on a top of the sealing cover, and an output end of the first heater acts on the sealing cover;

a second heater, wherein the second heater is provided between an outer side wall of the reaction chamber and an inner side wall of the vacuum chamber, and an output end of the second heater acts on a side wall of the reaction chamber; and a third heater, wherein the third heater is provided between the bottom of the reaction chamber and the bottom of the vacuum chamber, and the third heater acts on the bottom of the reaction chamber.

11. The ALD processing apparatus according to claim 10, wherein a first mounting plate is fixedly provided on the top of the sealing cover, the first heater comprises a plurality of first heating wires, a plurality of first heating wires are arranged in concentric corrugations, and a plurality of first heating wires are all fixed on a bottom surface of the first mounting plate, wherein the processing apparatus further comprises a first heat reflection assembly, and the first heat reflection assembly is fixedly arranged on a top surface of the first mounting plate, and wherein a fixing block is provided on the top surface of the first mounting plate, and the first heat reflection assembly is provided between the first mounting plate and the fixing block; and the first heat reflection assembly comprises several heat reflecting plates arranged in sequence, and two adjacent heat reflecting plates contact in a form of multi-point contact.

12. The ALD processing apparatus according to claim 10, wherein a second mounting plate is provided between the outer side wall of the reaction chamber and the inner side wall of the vacuum chamber, and two ends of a circumferential surface of the second mounting plate are closed rings, wherein the second mounting plate is fixedly provided on a top surface of the bottom of the vacuum chamber, and the second heater comprises a plurality of second heating wires, wherein all the second heating wires are coaxially arranged in a ring shape, the second heating wires are each fixedly provided on an inner side wall of the second mounting plate in a vertical direction, and the second heating wires are each sleeved on the outer side wall of the reaction chamber, wherein the processing apparatus further comprises a second heat reflection assembly, and the second heat reflection assembly is fixedly arranged on an outer side surface of the second mounting plate, and wherein the processing apparatus further comprises a third mounting plate, wherein the third mounting plate is fixedly provided between the second mounting plate and an inner wall of the vacuum chamber, the third mounting plate is in a closed loop, and the second heat reflection assembly is provided between the third mounting plate and the second mounting plate; and the second heat reflection assembly comprises several heat reflecting plates arranged in sequence, and two adjacent heat reflecting plates contact in a form of multi-point contact, wherein the top surface of the bottom of the vacuum chamber is provided with an annular groove, and the third mounting plate and the second heat reflection assembly are both fixedly provided in the annular groove, wherein the processing apparatus further comprises a third heat reflection assembly, and the third heat reflection assembly is fixedly arranged on an outer side surface of the third mounting plate;

the third heat reflection assembly comprises several heat reflecting plates arranged in sequence, and two adjacent heat reflecting plates contact in a form of multi-point contact, and wherein a first step is provided on the top surface of the bottom of the vacuum chamber, the first step is located outside the annular groove, and a bottom of the third heat reflection assembly is fixed on the first step.

13. The ALD processing apparatus according to claim 12, wherein a fourth mounting plate is provided between the bottom of the reaction chamber and the bottom of the vacuum chamber, the third heater comprises a plurality of third heating wires, a plurality of the third heating wires are arranged in concentric corrugations, and a plurality of the third heating wires are all fixed on a top surface of the fourth mounting plate, wherein the processing apparatus further comprises a fourth heat reflection assembly, and the fourth heat reflection assembly is fixedly arranged on a bottom surface of the fourth mounting plate;

the fourth heat reflection assembly comprises several heat reflecting plates arranged in sequence, and two adjacent heat reflecting plates contact in a form of multi-point contact, and wherein two stages of second steps are vertically provided in sequence on a circumferential surface of each of the connection blocks, the fourth mounting plate is fixedly provided on the second step located above, and the fourth heat reflection assembly is fixedly provided between the second step located below and the fourth mounting plate.

14. The ALD processing apparatus according to claim 10, wherein the processing apparatus further comprises a thermocouple mounting mechanism, and the thermocouple mounting mechanism comprises:

a fixed sleeve, wherein the fixed sleeve is fixedly provided on the top surface of the vacuum chamber;

a first corrugated pipe, wherein an upper end of the first corrugated pipe is fixedly connected to a top of an inner wall of the fixed sleeve, a lower end of the first corrugated pipe passes through a lower end of the fixed sleeve and the top of the vacuum chamber in sequence, and the lower end of the first corrugated pipe is located in the vacuum chamber; and a connecting sleeve, wherein the connecting sleeve is fixedly provided in the vacuum chamber, the lower end of the first corrugated pipe is connected to a top surface of the connecting sleeve, and a heating wire of the first heating assembly provided on the top of the sealing cover and a thermocouple for measuring a temperature on the top of the sealing cover are both fixedly provided in the connecting sleeve, wherein the top of the fixed sleeve is provided with a first connecting flange, the first connecting flange is annular, an inner side of the first connecting flange protrudes from the inner wall of the fixed sleeve, and the upper end of the first corrugated pipe is connected to the inner side of the first connecting flange, and wherein a first sealing groove is provided on the top of the fixed sleeve, a first sealing ring is provided in the first sealing groove, and the first connecting flange is provided on and covers the first sealing groove.

15. The ALD processing apparatus according to claim 1, wherein a first stopper is provided at an edge of the bottom of the sealing cover; and a boss is provided an opening on the top of the reaction chamber, and the boss can be embedded into the first stopper.

16. The ALD processing apparatus according to claim 1, wherein the lifting device comprises a lifting unit, a connecting frame, and a connecting rod, wherein the lifting unit is fixedly provided on the top of the vacuum chamber, the output end of the lifting unit stretches and contracts vertically;

the connecting frame is located above the vacuum chamber, and the connecting frame is connected with the output end of the lifting unit; and an upper end of the connecting rod is fixedly connected with the connecting frame, a lower end of the connecting rod passes through the top of the vacuum chamber in a sealed manner, and the sealing cover is fixedly provided on the lower end of the connecting rod, wherein two lifting units are provided opposite to each other, two connecting rods are provided opposite to each other, and a connecting line of the two lifting units is located on a perpendicular bisector of a connecting line of the two connecting rods, and wherein the connecting rods are each provided with a sealing device, and the sealing device comprises:

a first sleeve, wherein the first sleeve is fixedly provided on a circumferential surface of the connecting rod, and the first sleeve is located above the vacuum chamber;

a second sleeve, wherein the second sleeve is fixedly arranged on a top surface of the top of the vacuum chamber, and the other end of the connecting rod movably passes through the second sleeve, so as to enter the vacuum chamber; and a second corrugated pipe, wherein the first sleeve and the second sleeve are connected through the second corrugated pipe, and the second corrugated pipe is sleeved on the circumferential surface of the connecting rod.

17. The ALD processing apparatus according to claim 1, wherein the grabbing device comprises:

a frame, wherein the frame is fixedly provided on a bottom of the sealing cover;

grippers, wherein two grippers are provided opposite to each other, the two grippers are arranged opposite to each other along a second direction, the grippers each comprise two connecting arms and a supporting arm, upper ends of the two connecting arms are each fixedly connected to an end of the frame in the first direction, and lower ends of the two connecting arms are each provided with a connecting projection extending in a direction towards the other gripper, wherein the two connecting projections are connected through the supporting arm, wherein middle portions of the two connecting arms are also connected by a reinforcing arm.

18. The ALD processing apparatus according to claim 1, wherein the transporting device comprises a transporting chamber and a transporting plate, wherein the transporting chamber is arranged on a side of the vacuum chamber in a second direction, and the transporting chamber is in operable communication with the vacuum chamber, and wherein the transporting plate is provided in the transporting chamber, the transporting plate operably enters the vacuum chamber, and the transporting plate is provided above the reaction chamber, wherein a sealing door that can be opened is provided at the side of the vacuum chamber in the second direction, wherein a slot is provided at a joint between the vacuum chamber and the transporting chamber, the slot is open on a top, and the sealing door is operably inserted into the slot, so as to seal the side of the vacuum chamber in the second direction;

a supporting frame is provided on the vacuum chamber, a second driving mechanism is provided on the supporting frame, an output end of the second driving mechanism vertically moves back and forth, and the sealing door is connected to the output end of the second driving mechanism, and wherein the supporting frame comprises two butt-jointed connecting plates, the two connecting plates are butt-jointed to form a sealed chamber, the second driving mechanism is fixedly provided on the top of the sealed chamber, a bottom of the sealed chamber is open, and a dimension of the sealed chamber in a width direction is consistent with a thickness of the sealing door.

19. An ALD processing method, carried out on the basis of an ALD processing apparatus, wherein the ALD processing apparatus comprises:

a reactor, wherein the reactor comprises a vacuum chamber and a reaction chamber, the reaction chamber is built in the vacuum chamber, the reaction chamber is open at a top, and a bottom of the reaction chamber is formed with a gas inlet channel and a gas outlet channel, wherein the gas inlet channel and the gas outlet channel are formed opposite to each other with respect to a centerline of the bottom of the reaction chamber in a first direction;

a lifting device, wherein the lifting device is provided on the reactor, an output end of the lifting device stretches and contracts vertically, the output end of the lifting device is provided with a sealing cover, and the sealing cover operably seals the top of the reaction chamber;

a transporting device, wherein the transporting device is configured to transport a substrate into the vacuum chamber; and a grabbing device, wherein the grabbing device is provided on the sealing cover, and the grabbing device is configured to grab the substrate transported into the vacuum chamber;

wherein a transferring chamber is fixedly provided at the bottom of the reaction chamber, the transferring chamber is open at a top, the bottom of the reaction chamber is provided on and covers the top of the transferring chamber, and two partition plates are provided in the transferring chamber, wherein the two partition plates divide the transferring chamber into a first chamber, a second chamber, and a third chamber that are sequentially arranged along a second direction, the gas inlet channel is in communication with the first chamber, and the gas outlet channel is in communication with the third chamber, wherein a bottom of the first chamber is formed with a gas inlet main hole, and a bottom of the third chamber is formed with a gas outlet main hole;

wherein the processing method comprises:

transporting the substrate into the vacuum chamber through the transporting device, and transferring the substrate onto the grabbing device;

operating the transporting device to withdraw from the vacuum chamber, sealing the vacuum chamber, and vacuumizing the vacuum chamber;

operating the lifting device to cover the top of the reaction chamber with the sealing cover, wherein the substrate is located in the sealed reaction chamber; and injecting a precursor source from the gas inlet channel of the reaction chamber, and after purging the substrate in the reaction chamber with the precursor source, discharging the precursor source from the gas outlet channel of the reaction chamber, thus completing the ALD processing of the substrate.

\* \* \* \* \*